United States Patent
Lien et al.

(10) Patent No.: US 6,262,907 B1
(45) Date of Patent: Jul. 17, 2001

(54) TERNARY CAM ARRAY

(75) Inventors: Chuen-Der Lien, Los Altos Hills; Chau-Chin Wu, Cupertino, both of CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/574,747

(22) Filed: May 18, 2000

(51) Int. Cl.$^7$ .................................................. G11C 15/00
(52) U.S. Cl. ........................................ 365/49; 365/189.07
(58) Field of Search ............................. 365/49, 168, 154, 365/189.07, 188, 203, 204

(56) References Cited

U.S. PATENT DOCUMENTS

| | | |
|---|---|---|
| 4,780,845 | 10/1988 | Threewitt . |
| 5,051,948 | 9/1991 | Watabe et al. . |
| 5,111,427 | 5/1992 | Kobayashi et al. . |
| 5,319,589 | 6/1994 | Yamagata et al. . |
| 5,515,310 * | 5/1996 | Winters ................................. 365/49 |
| 5,642,320 | 6/1997 | Jang . |
| 5,852,569 * | 12/1998 | Srinivasan et al. ..................... 365/49 |
| 5,949,696 | 9/1999 | Threewitt . |
| 6,044,005 | 3/2000 | Gibson et al. ......................... 365/49 |
| 6,128,207 * | 10/2000 | Lien et al. ............................. 365/49 |

* cited by examiner

*Primary Examiner*—Richard Elms
*Assistant Examiner*—Hien Nguyen
(74) *Attorney, Agent, or Firm*—Bever, Hoffman & Harms, LLP

(57) ABSTRACT

A CAM array including volatile or non-volatile ternary CAM cells that discharge their associated match line through a special discharge line (e.g., a low match line), instead of through the bit line, is disclosed. Each ternary CAM cell includes a pair of storage elements that are used to store a data bit value, a comparison element that is used to compare the stored value with an applied data value, and a discharge element that is coupled between the discharge line and the match line. During operation, when the applied data value matches the stored value, the discharge element de-couples the discharge line from the match line (i.e., a high voltage on the match line remains high). Conversely, when the applied data value does not match the stored value, the discharge elements couple the discharge line to the match line, thereby discharging the match line to the discharge line. By discharging the match line to the discharge line instead of the bit lines of the CAM array, the size of the CAM array is not limited by the length bit lines. Because the voltage on the match line is sensed to determine the match/no-match condition of a CAM cell, the match line does not need to be completely discharged.

32 Claims, 9 Drawing Sheets

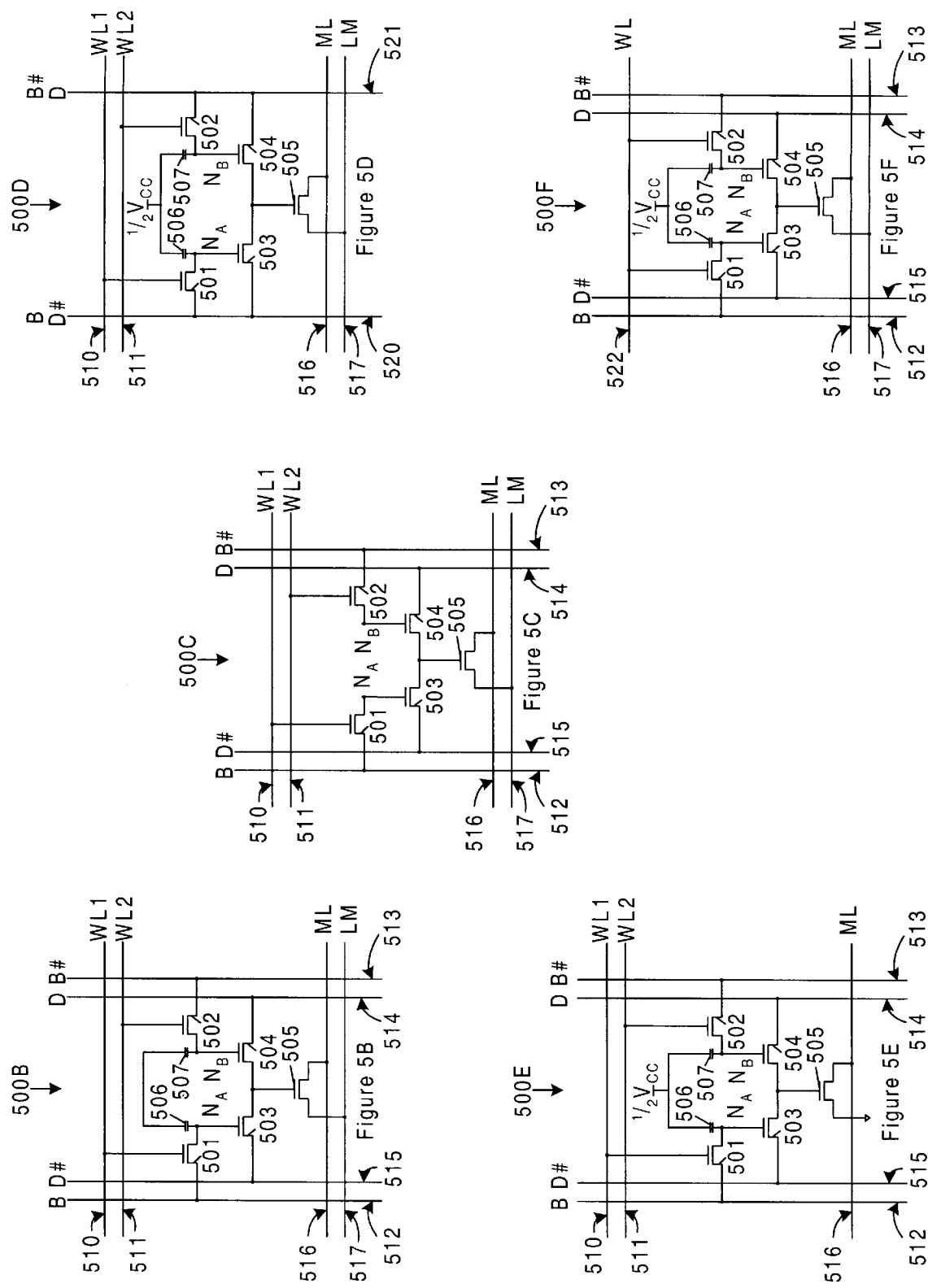

TERNARY CAM ARRAY

FIELD OF THE INVENTION

The present invention relates to content addressable memory (CAM) arrays. More specifically, the present invention relates to ternary CAM cells and methods for operating these cells in a CAM array.

DISCUSSION OF RELATED ART

Unlike conventional random access memory (RAM) arrays, CAM arrays include memory cells that are addressed in response to their content, rather than by a physical address within a RAM array. That is, data words stored in a RAM array are accessed by applying address signals to the RAM array input terminals. In response to each unique set of address signals, a RAM array outputs a data value that is read from a portion of the RAM array designated by the address. In contrast, a CAM array receives a data value that is compared with all of the data values stored in rows of the CAM array. In response to each unique data value applied to the CAM array input terminals, the rows of CAM cells within the CAM array assert or de-assert associated match signals indicating whether or not one or more data values stored in the CAM cell rows match the applied data value.

CAM arrays are useful in many applications, such as search engines. For example, assume an employee list is searched to identify all employees with the first name "John". The first names are written into a CAM array such that they are stored in a predetermined order (e.g., according to employee number). The input data value ("John") is then applied to the CAM input terminals. When one or more stored data values match the input data value, the match line coupled to the one or more matching rows of CAM cells generates a high output signal. By identifying which rows have associated high match lines, and comparing those row numbers with the employee number list, all employees named "John" are identified. In contrast, to search a RAM array containing the same employee list, a series of addresses must be applied to the RAM array so that each stored data value is read out and compared with the "John" data value. Because each RAM read operation takes one clock cycle, a relatively large amount of time is required to read and compare a particular data value with all data values stored in a RAM array.

There are two types of CAM cells typically used in CAM arrays: binary CAM cells and ternary CAM cells. Binary CAM cells store one of two bit values: a logic high value or a logic low value. When the logic value stored in the binary CAM cell matches an applied data value, then the match line coupled to the binary CAM cell is maintained at a logic high value (assuming all other CAM cells coupled to the CAM array row also match), thereby indicating that a match has occurred. In contrast, when the logic value stored in the binary CAM cell does not match an applied data value, then the match line coupled to the binary CAM cell is pulled down, thereby indicating that a match has not occurred. Ternary CAM cells can store any one of three values: a logic high, a logic low, or a "don't care" value. When storing logic high and logic low values, a ternary CAM cell operates like a binary CAM cell. In addition, a ternary CAM cell storing a don't care value will provide a match condition for any data bit value applied to that CAM cell. This "don't care" capability allows CAM arrays to indicate when a data value matches a selected group of ternary CAM cells in a row of the CAM array. For example, assume each row of a ternary CAM array has eight ternary CAM cells. Additionally assume that the first four ternary CAM cells of each row each store one of a logic high and a logic low value (for comparison to the first four bits of an input 8-bit data value) and the last four ternary CAM cells of each row store "don't care" values. Under these conditions, when an 8-bit data value is applied to the ternary CAM array, a match occurs for each row of the CAM array in which the data values stored in the first four ternary CAM cells match the first four bits of the applied 8-bit data value.

Binary and ternary CAM cells can be characterized as volatile (i.e., in which the logic high, logic low, or don't care value is stored in volatile components, such as capacitors), or non-volatile (i.e., in which values are stored in non-volatile components, such as EPROM transistors).

FIG. 1 is a schematic diagram of a first prior art volatile ternary CAM cell 100 as described in U.S. Pat. No. 5,642, 320. CAM cell 100 includes volatile (e.g., field-effect) transistors Q1–Q6. Transistor Q1 has a drain coupled to the source of transistor Q2. Transistor Q3 has a drain coupled to the source of transistor Q4. Transistor Q2 has a gate coupled to the drain of transistor Q6. Transistor Q4 has a gate coupled to the drain of transistor Q5. A match line is commonly coupled to the sources of transistors Q1 and Q3. A bit line BL is commonly coupled to the gate of transistor Q1 and the source of transistor Q5. An inverted bit line BL# is commonly coupled to the gate of transistor Q3 and the source of transistor Q6. A word line WL is commonly coupled to the gates of transistors Q5–Q6. The drains of transistors Q2 and Q4 are commonly coupled to ground. CAM cell 100 stores one of a logic high, a logic low, and a don't care value in dynamic storage nodes $N_A$ and $N_B$. A don't care value is a value that results in a match condition for all applied data values. To store a logic high value, a logic high value is applied to bit line BL and a logic low value applied to inverted bit line BL#. A logic high value is applied to word line WL to turn on transistors Q5–Q6, thereby coupling the logic high value of the bit line BL to both node $N_B$ and the gate of transistor Q4 and coupling the logic low value of the inverted bit line BL# to both node $N_A$ and the gate of transistor Q2. As a result, node $N_A$ stores a logic low value and node $N_B$ stores a logic high value.

To store a logic low value, a logic low value is applied to bit line BL and a logic high value applied to inverted bit line BL#. A logic high value is applied word line WL to turn on transistors Q5–Q6, thereby coupling the logic low value of the bit line BL to both node $N_B$ and the gate of transistor Q4 and coupling the logic high value of the inverted bit line BL# to both node $N_A$ and the gate of transistor Q2. As a result, node $N_A$ stores a logic high value and node $N_B$ stores a logic low value.

To store a don't care value, a logic low value is applied to both bit line BL and to inverted bit line BL#. A logic high value is applied word line WL to turn on transistors Q5–Q6, thereby coupling the logic low value of the bit line BL to both node $N_B$ and the gate of transistor Q4 and coupling the logic low value of the inverted bit line BL# to both node $N_A$ and the gate of transistor Q2. As a result, both nodes $N_A$ and node $N_B$ store logic low values.

CAM cell 100 performs a compare operation by precharging the match line ML to a logic high value and then sensing any current on the match line ML. A no-match condition during a compare operation results in the discharge of the match line ML to ground. The discharge causes a current to flow between match line ML and ground. A current sensor coupled to match line ML senses this current flow, thereby indicating the no-match condition. In contrast, a match condition during a compare operation results in the match line ML remaining charged to a logic high value. Because the match line ML is not discharged during a match condition, no current will flow on match line ML. As a result, no current is sensed on match line ML by the associated current sensor, thereby indicating the match condition.

During a compare operation, word line WL is held to a logic low value and the compare data is applied to bit line BL (e.g., logic high value) and inverted bit line BL# (e.g., logic low value). If CAM cell 100 stores a logic high value, then the logic low value stored at node $N_A$ turns off transistor Q2, thereby de-coupling the drain of transistor Q1 from ground and the logic high value stored at node $N_B$ turns on transistor Q4, thereby coupling the drain of transistor Q3 to ground. The logic low value of the inverted bit line BL# turns off transistor Q3, thereby de-coupling match line ML from ground. Under these conditions, the match line ML remains pre-charged to a logic high value, thereby indicating a match condition.

Similarly, if CAM cell 100 stores a don't care value, then the logic low values stored at nodes $N_A$ and $N_B$ turn off transistors Q2 and Q4, respectively, thereby de-coupling the drains of transistors Q1 and Q3, respectively, from ground. Under these conditions, match line ML remains pre-charged to a logic high value, thereby indicating a match condition.

If CAM cell 100 stores a logic low value, then the logic high value stored at node $N_A$ turns on transistor Q2, thereby coupling the drain of transistor Q1 to ground, and the logic low value stored at node $N_B$ turns off transistor Q4, thereby de-coupling the drain of transistor Q3 from ground. The logic high value of the bit line BL turns on transistor Q1, thereby coupling match line ML to ground through turned on transistor Q2. Under these conditions, the match line ML is discharged to ground, thereby indicating a no-match condition.

A problem with prior art CAM cell 100 is that the drains of transistors Q2 and Q4 are permanently tied to ground. CAM cell 100 requires bit line BL and inverted bit line BL# to have logic low values between operations, thereby turning off transistors Q1 and Q3, respectively. Because bit line BL and inverted bit line BL# typically have opposite logic values (e.g., bit line BL has a high logic value and inverted bit line BL# has a low logic value), one of bit line BL and inverted bit line BL# must be grounded between operations and a logic high value re-applied for a new operation. The grounding of one of bit line BL and inverted bit line BL# requires power, because the system ground is used to lower the voltage. Similarly, the re-application of a logic high value to one of bit line BL and inverted bit line BL# requires power, because the system supply voltage is used to raise the voltage. It would be desirable to operate a ternary CAM cell without these power drains. The logic low value requirement for bit line BL and inverted bit line BL# between operations additionally creates noise coupling on other array lines. Because the value on one of bit line BL and inverted bit line BL# is changed asymmetrically to the other, transverse lines (i.e., lines that cross both bit line BL and inverted bit line BL#) experience noise. It would be desirable to operate a ternary CAM cell without this noise affecting other lines in the CAM array. It would also be desirable to have a ternary CAM cell that senses small changes in the charge on a match line, thereby saving power by avoiding the complete discharge of the match line during compare operations.

FIG. 2 is a schematic diagram of a second prior art non-volatile ternary CAM cell 200 as described in U.S. Pat. No. 5,051,948. CAM cell 200 includes volatile transistors MD and MW1–MW2 and non-volatile (e.g., EPROM) transistors MF1–MF2. Transistor MD has a drain coupled to the sources of transistors MF1–MF2. Transistor MF1 has a gate coupled to the drain of transistor MW2. Transistor MF2 has a gate coupled to the drain of transistor MW1. A match line ML is commonly coupled to a source and a gate of transistor MD. A bit line BL is commonly coupled to the sources of transistors MF1 and MW1. An inverted bit line BL# is commonly coupled to the sources of transistors MF2 and MW2. A word line WL is commonly coupled to the gates of transistors MW1–MW2.

CAM cell 200 stores one of a logic high, a logic low, and a don't care value. To store a logic high value, a logic high value (e.g., a $V_{cc}$ supply voltage of 5 Volts) is applied to bit line BL and a logic low value (e.g., 0 Volts) is applied to inverted bit line BL#. A programming voltage of approximately twice the $V_{cc}$ supply voltage (i.e., 10 Volts) is applied to match line ML, thereby turning on transistor MD. Turned on transistor MD applies the programming voltage on the match line ML to the sources of transistors MF1–MF2. A logic high value is applied to word line WL, thereby turning on transistors MW1–MW2. Turned on transistor MW2 couples the logic low value of inverted bit line BL# to the gate of transistor MF1, thereby turning off transistor MF1. As a result, no current flows between the source and drain of transistor MF1, thereby causing transistor MF1 to retain a low threshold voltage state. The threshold voltage of a transistor is that voltage which must be applied to the transistor to cause current to flow from the source to the drain. Turned on transistor MW1 couples the logic high value of bit line BL to the gate of transistor MF2, thereby turning on transistor MF2. As a result, current flows between the source (10 Volts) and the drain (0 Volts) of transistor MF2. Under these conditions, electrons are injected into the floating gate of transistor MF2, thereby causing the threshold voltage of transistor MF2 to increase to a high threshold voltage state.

To store a logic low value in CAM cell 200, a logic low value is applied to bit line BL and a logic high value is applied to inverted bit line BL#. A programming voltage is applied to match line ML, thereby turning on transistor MD. Turned on transistor MD to applies the programming voltage on the match line ML to the sources of transistors MF1–MF2. A logic high value is applied to word line WL, thereby turning on transistors MW1–MW2. Turned on transistor MW2 couples the logic high value of inverted bit line BL# to the gate of transistor MF1, thereby turning on transistor MF1. As a result, current flows between the source (10 Volts) and the drain (0 Volts) of transistor MF1. Under these conditions, electrons are injected into the floating gate of transistor MF1, thereby causing the threshold voltage of transistor MF1 to increase to a high threshold voltage state. Turned on transistor MW1 couples the logic low value of bit line BL to the gate of transistor MF2, thereby turning off transistor MF2. As a result, no current flows between the source and drain of transistor MF2, thereby causing transistor MF2 to retain a low threshold voltage state.

To store a don't care value in CAM cell 200, first transistor MF1 is written and then transistor MF2 is written. To write transistor MF1, a logic low value is applied to bit line BL and a logic high value is applied to inverted bit line BL#. A programming voltage is applied to match line ML, thereby turning on transistor MD. Turned on transistor MD to applies the programming voltage on the match line ML to the sources of transistors MF1–MF2. A logic high value is applied to word line WL, thereby turning on transistors MW1–MW2. Turned on transistor MW2 couples the logic high value of inverted bit line BL# to the gate of transistor MF1, thereby turning on transistor MF1. As a result, current flows between the source (10 Volts) and the drain (0 Volts) of transistor MF1. Under these conditions, electrons are injected into the floating gate of transistor MF1, thereby causing the threshold voltage of transistor MF1 to increase to a high threshold voltage state. Turned on transistor MW1 couples the logic low value of bit line BL to the gate of transistor MF2, thereby turning off transistor MF2. As a result, no electrons are injected into the floating gate of transistor MF2. Transistor MF2 is written similarly to transistor MF1, with a logic high value applied to bit line BL and a logic low value applied to inverted bit line BL#.

Similar to first prior art CAM cell 100 (discussed above), CAM cell 200 performs a compare operation by sensing the current on match line ML. Thus, the match line ML is pre-charged to a logic high value and a current sensor senses any current flow during discharge of that logic high value. During a compare operation, word line WL is held to a logic high value, thereby turning on transistors MW1–MW2, and the compare data is applied to bit line BL (e.g., logic high value) and inverted bit line BL# (e.g., logic low value). The pre-charged logic high value of the match line ML turns on transistor MD, thereby applying the pre-charged logic high value at the sources of transistors MF1–MF2.

If CAM cell 200 stores a logic high value, then the logic low value of inverted bit line BL# provided to the gate of transistor MF1 through turned on transistor MW2 de-couples the logic high value of the bit line BL from the pre-charged match line ML. Additionally, the logic high value of the bit line BL is provided to the gate of transistor MF2 through turned on transistor MW1. However, because transistor MF2 is in a high threshold state, this logic high value is insufficient to turn on transistor MF2. As a result, the match line ML remains pre-charged to a logic high value.

Similarly, if CAM cell 200 stores a don't care value, a logic high value is insufficient to turn on transistors MF1–MF2, which are in high threshold voltage states. As a result, match line ML is de-coupled from the logic values applied to bit line BL and inverted bit line BL#. Thus, match line ML remains pre-charged to a logic high value, indicating a match condition.

If CAM cell 200 stores a logic low value, then the logic low value applied to inverted bit line BL# provided to the gate of transistor MF1 turns off transistor MF1. Additionally, the logic high value of bit line BL is applied to the gate of transistor MF2, thereby coupling the logic low value of inverted bit line BL# to the pre-charged match line ML through turned on transistor MF2. As a result, match line ML is discharged through inverted bit line BL#, thereby causing a current to flow on match line ML. This current is sensed to indicate a no-match condition.

One problem with prior art CAM cell 200 is that, in large CAM arrays, the resistance of bit line BL (and inverted bit line BL#) can impede the discharge of match line ML. In large CAM arrays, many CAM cells similar to CAM cell 200 are coupled to elongated bit line BL, which must be long enough to couple each of these CAM cells. It is well known that the resistance of a long line is much greater than that of a short line having the same width. To lower the resistance of a long line, the width of the long line must be increased, thereby occupying more layout area. During a match operation in a large CAM array, a large current is drawn through bit line BL. As a result, bit line BL must be long enough to accommodate the CAM cells and wide enough to prevent long delays and signal degradation that is caused by the resistance of the line. Conversely, when the bit line BL remains narrow, CAM arrays made up of CAM cells 200 have a limited size due to the resistance of the narrow bit line BL.

FIG. 3 is a schematic diagram of a third prior art volatile ternary CAM cell 300 as described in U.S. Pat. No. 5,319, 589. CAM cell 300 includes transistors 301–305 and capacitors 306–307. A first plate of capacitor 306 is coupled to a first plate of capacitor 307. A second plate of capacitor 306 is coupled to dynamic storage node $N_0$. A second plate of capacitor 307 is coupled to dynamic storage node $N_1$. Transistor 301 has a drain coupled to node $N_0$. Transistor 303 has a gate coupled to node $N_0$. Transistor 304 has a gate coupled to node $N_1$ and a drain coupled to a drain of transistor 303. Transistor 305 has a source coupled to the drains of transistors 303–304. Word line WL is commonly coupled to the gates of transistors 301–302. Bit line BL is commonly coupled to the sources of transistors 301 and 303. Inverted bit line BL# is commonly coupled to the sources of transistors 302 and 304. Match line ML is commonly coupled to a gate and a drain of transistor 305.

CAM cell 300 stores one of a logic high, a logic low, and a don't care value. To store a logic high value, a logic high value is applied to bit line BL and a logic low value is applied to inverted bit line BL#. The match line ML is held to a logic low level, thereby turning off transistor 305. The word line WL is held to a logic high value, thereby turning on transistors 301–302. Turned on transistor 301 provides the logic high value of bit line BL to capacitor 306, thereby storing a positive charge in capacitor 306. Similarly, turned on transistor 302 provides the logic low value of inverted bit line BL# to capacitor 307, thereby storing a negative charge in capacitor 307. As a result, when word line WL is brought low, thereby turning off transistors 301–302, node $N_0$ stores a high logic value and node $N_1$ stores a low logic value.

Similarly, to store a logic low value, a logic low value is applied to bit line BL and a logic high value is applied to inverted bit line BL#. The match line ML is held to a logic low level, thereby turning off transistor 305. The word line WL is held to a logic high value, thereby turning on transistors 301–302. Turned on transistor 301 provides the logic low value of bit line BL to capacitor 306, thereby storing a negative charge in capacitor 306. Similarly, turned on transistor 302 provides the logic high value of inverted bit line BL# to capacitor 307, thereby storing a positive charge in capacitor 307. As a result, when word line WL is brought low, thereby turning off transistors 301–302, node No stores a logic low value and node $N_1$ stores a logic high value.

To store a don't care logic value in CAM cell 300, logic low values are applied to bit line BL and inverted bit line BL#. The match line ML is held to a logic low level, thereby turning off transistor 305. The word line WL is held to a logic high value, thereby turning on transistors 301–302. Turned on transistor 301 provides the logic low value of bit line BL to capacitor 306, thereby storing a negative charge in capacitor 306. Similarly, turned on transistor 302 provides the logic low value of inverted bit line BL# to capacitor 307, thereby storing a negative charge in capacitor 307. As a result, when word line WL is brought low, thereby turning off transistors 301–302, nodes $N_0$ and $N_1$ store low logic values.

Similar to first prior art CAM cell 100 (discussed above), CAM cell 300 performs a compare operation by sensing the current on match line ML. Prior to a compare operation, match line ML is pre-charged to a logic high value. During a compare operation, a no-match condition between the applied data and the value stored at nodes $N_0$–$N_1$ of CAM cell 300 causes match line ML to discharge to a logic low value. Thus, the voltage on match line ML is discharged through transistor 305 to one of the bit lines BL and BL# (i.e., through one of transistors 303–304, respectively). This discharge causes a current on match line ML.

One problem with CAM cell 300 is similar to that of second prior art CAM cell 200, discussed above. In large CAM arrays, many CAM cells similar to CAM cell 300 are coupled to bit line BL. Namely, because match line ML is discharged through bit line BL and inverted bit line BL#, the size of a CAM array including CAM cells 300 is limited.

It would therefore be desirable to have a volatile ternary CAM cell that does not discharge through the bit line, thereby avoiding match condition delays.

SUMMARY

Accordingly, the present invention provides a CAM array including volatile or non-volatile ternary CAM cells that discharge their associated match line through a special discharge line (e.g., a "low match" line), instead of through the bit line. The use of a special discharge line reduces power requirements and reduces noise coupling on other lines in the CAM cell array. Power requirements are further reduced by a low voltage swing on both the match line and the special discharge line. Each ternary CAM cell includes a pair of storage elements that are used to store a data bit value, a comparison element that is used to compare the stored value with an applied data value, and a discharge element that is coupled between the discharge line and the match line. During operation, when the applied data value matches the stored value, the discharge element de-couples the discharge line from the match line (i.e., a high voltage on the match line remains high). Conversely, when the applied data value does not match the stored value, the discharge elements couple the discharge line to the match line, thereby discharging the match line to the discharge line. By discharging the match line to the discharge line instead of the bit lines of the CAM array, the size of the CAM array is not limited by the length bit lines.

Voltage on the match line is sensed by a conventional voltage sensor to determine the match/no-match condition of a CAM cell. Therefore, a slight drop in the voltage of the match line will register as a no-match condition. By sensing the voltage on the match line, the match line does not need to be completely discharged to determine the match/no-match condition of a CAM cell.

The present invention will be more fully understood in view of the following description and drawings.

BRIEF DESCRIPTION OF THE DRAWINGS

FIGS. 5B–5F are a schematic diagrams of ternary CAM cells in accordance with variations of the embodiment of FIG. 5A;

DETAILED DESCRIPTION

Figure 4A:
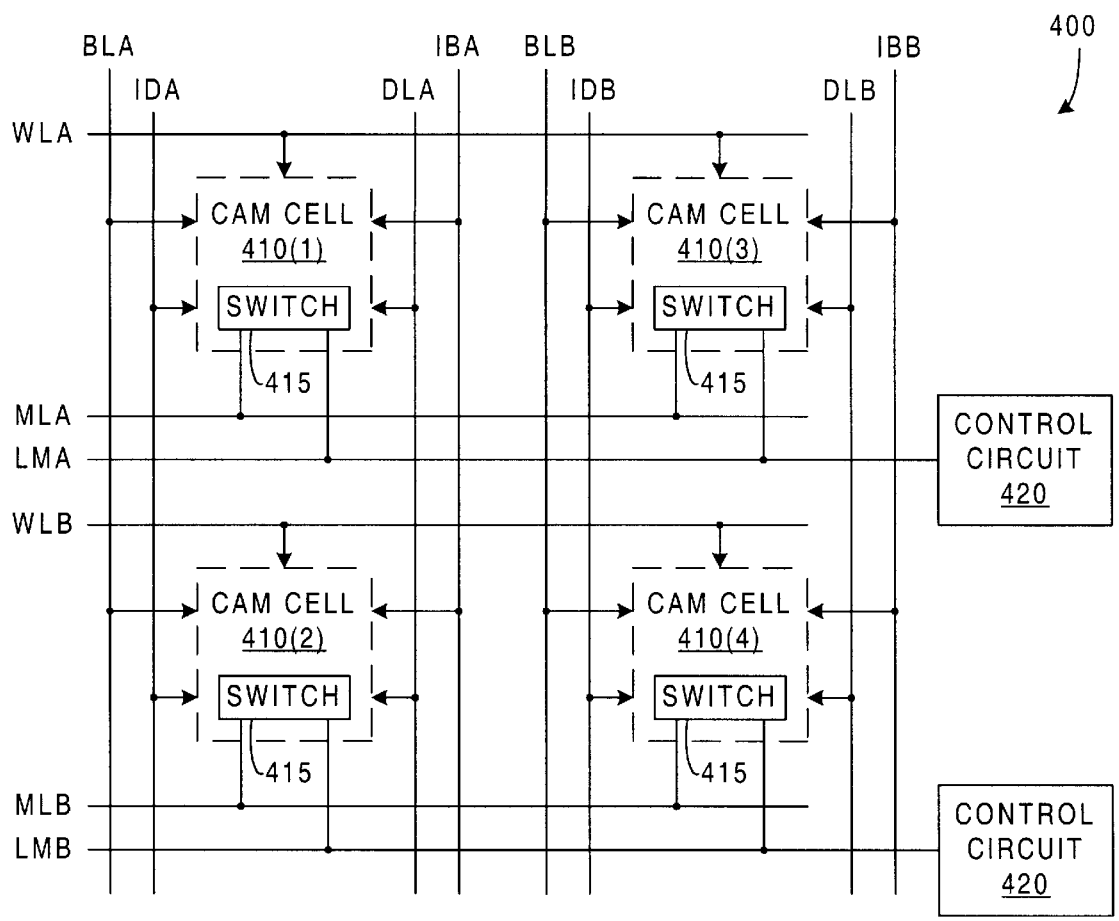
FIG. 4A is a schematic diagram of a ternary CAM cell in accordance with an embodiment of the present invention.

FIG. 4A is a simplified schematic diagram showing a portion of a CAM array 400 that includes CAM cells 410(1) through 410(4) in accordance with the present invention. CAM cells 410(1) through 410(4) are coupled to bit lines BLA and BLB, inverted bit lines IBA and IBB, word lines WLA and WLB, data lines DLA and DLB, inverted data lines IDA and IDB, match lines MLA and MLB, and discharge lines LMA and LMB. Note that, in some embodiments, the data lines and bit lines are co-formed (i.e., the same line is used to transmit data signals during write and comparison operations, discussed below). CAM array 400 also includes one or more control circuits 420 coupled to discharge lines LMA and LMB. CAM array 400 also includes signal generation circuitry and detection circuitry (not shown) that generates voltage levels on the various lines in accordance with known techniques.

Similar to prior art CAM cells, each of CAM cells 410(1) through 410(4) includes one or more volatile or non-volatile elements (not shown) that are coupled to one of bit lines BLA and BLB and one of word lines WLA and WLB for storing a data value that is transmitted on the bit lines during a memory write operation. In addition, each of CAM cells 410(1) through 410(4) also includes a switch (comparison circuit) 415 that is coupled between an associated match line MLA or MLB and an associated discharge line LMA or LMB. For example, switch 415 of CAM cell 410(1) is coupled between match line MLA and discharge line LMA.

Figure 4B:
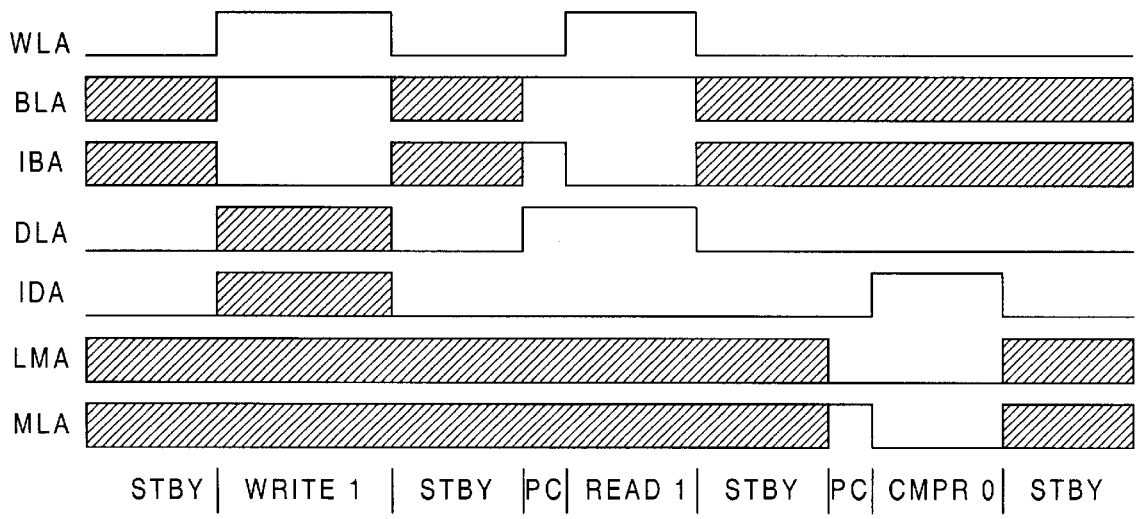
FIG. 4B is a timing diagram in accordance with the CAM cell of FIG. 4A.

FIG. 4B is a timing diagram that shows signal (voltage) levels on the various lines of CAM cell 410(1) for a particular embodiment of the present invention (e.g., FIGS. 5A and 6 described below) during standby (STBY), write (WRITE), read (READ including a pre-charge operation, PC) and comparison (CMPR including a pre-charge operation, PC) operations. The one or more control circuits 420 generate the signal levels on discharge lines LMA and LMB. Well known control circuitry (not shown) is used to generate signal levels on the remaining lines. Shaded values in the timing diagram indicate a "don't care" state where a specific voltage level is not required and therefore the last voltage level of the line is typically maintained.

The operation of an individual CAM cell in CAM array 400 will now be described with reference to FIGS. 4A and 4B. In a standby state, for example, of CAM cell 410(1), word line WL is pulled down to a logic low value, thereby turning off CAM cell 410(1). The data line DLA and inverted data line IDA are held to logic low values to turn off switch 415. The values of the other coupled lines (BLA, IBA, MLA and LMA) are preferentially left in their last state.

A data value (e.g., a logic high value) is written to CAM cell 410(1) by pulling up word line WLA and applying the data value (i.e., a logic high value) on bit line BLA and the inverted data value (i.e., a logic low value) on inverted bit line IBA. During the data write operation, data line DLA, inverted data line IDA, match line MLA and discharge line LMA are preferentially held to their last values.

Some time after CAM cell 410(1) returns to a standby state, a read operation is performed in which the stored data value is read. Bit line BLA and inverted bit line IBA are pre-charged to a logic high value and then word line WLA is brought to a logic high value. The logic high value stored in CAM cell 410(1) causes bit line BLA to remain at a logic high value, but discharges inverted bit line IBA to a logic low value. The data stored in CAM cell 410(1) is read from bit line BLA and inverted bit line IBA. After CAM cell 410(1) returns to a standby condition, a comparison operation is performed in which the stored data value is compared with an applied data value (e.g., a logic low value) transmitted on data line DLA and inverted data line IDA. Word line WLA and discharge line LMA are held to logic low values and match line MLA is pre-charged to a logic high value. If the received data value matches the stored data value, switch 415 remains open and match line MLA remains de-coupled from discharge line LMA. However, if the received data value does not match the stored data value, switch 415 closes, thereby connecting match line MLA to discharge line LMA (i.e., pulling down match line MLA to a low voltage level). By discharging each match line MLA and MLB to corresponding discharge lines LMA and LMB instead of to bit line BLA, the limitations associated with prior art CAM arrays (discussed above) are avoided. In particular, although additional space is required to provide discharge lines LMA and LMB in CAM array 400, the length of bit lines BLA and BLB is not limited, as in prior art CAM arrays. Therefore, a CAM array incorporating the structure shown in FIG. 4A can be much larger than prior art CAM arrays in which the match lines discharge to the bit line.

For example, in one embodiment data line DLA and inverted data line IDA are equalized during a standby operation. Because equalization requires no power drain from the $V_{cc}$ system supply voltage or the ground supply voltage, the only power required during the standby operation is that of recharging the data line DLA (e.g., to a logic high voltage) and the inverted data line IDA (e.g., to a logic low voltage) at the end of the standby operation.

In another embodiment, a controlled voltage on low match line 517 allows data line DLA and inverted data line IDA to be left in their last state. For example, during a standby operation, low match line 517 is held to the voltage of match line 516, thereby preventing the discharge of match line 516. This embodiment beneficially allows power savings by eliminating the need to change the voltage on data line DLA and inverted data line IDA unless the applied data value changes. In a variation on this embodiment, the voltage on match line 516 is equalized with the voltage on low match line 517.

In one embodiment, low match line 517 is coupled to a drain of a transistor having a source coupled to ground and a gate coupled to a control signal. In this embodiment, the control signal has a logic low value during pre-charge of match line 516 and equalization of data line DLA and inverted data line IDA, thereby allowing match line 516 and low match line 517 to equalize by de-coupling low match line 517 from ground. The control signal has a logic high value otherwise, thereby coupling low match line 517 to ground.

In accordance with another aspect of the present invention, a voltage level on each discharge line LMA and LMB is controlled by a control circuit 420 to have a first (e.g., high) voltage level during at least one of memory write, read, and pre-charge operations, and to have a second (e.g., low) voltage level during comparison operations. Because the discharge lines LMA and LMB have a high voltage level during some operations, data lines DLA and DLB and inverted data lines IDA and IDB may be maintained at their last values or equalized to a different value without discharging any voltage present on match lines MLA and MLB. As a result, less power is required to maintain a voltage (e.g., a logic low voltage) on data lines DLA and DLB and inverted data lines IDA and IDB. Similarly, because none of data lines DLA and DLB and inverted data lines IDA and IDB need to be coupled to system power or ground between operations, less total power is consumed by CAM array 400 than in conventional CAM arrays. Further power savings occur by having a low voltage swing on match lines MLA–MLB and discharge lines LMA-LBM. For example, one embodiment uses a voltage swing of 0.6 Volts to 1.2 Volts. Therefore, the control circuit 420 provides a power savings in the operation of CAM array 400. As an additional benefit, because data lines DLA and DLB may be maintained at a voltage symmetrical to inverted data lines IDA and IDB, respectively, noise coupling is reduced on other lines crossing the CAM array.

With the operation of each CAM cell 410(1) through 410(4) established, the operation of CAM array 400 will now be explained. Namely, data words are stored in the rows of CAM cells, and compared with data words transmitted on data lines DLA and DLB and inverted data lines DLB and IDB. For example, a first two-bit data word is stored in CAM cells 410(1) and 410(3), and a second two-bit data word is stored in CAM cells 410(2) and 410(4). A "match" data word is simultaneously compared with both stored data words by transmitting the "match" data word on data lines DLA and DLB and the inverse of the "match" data word on inverted data lines IDA and IDB. If each bit of the "match" data word is equal to the data bits stored in CAM cells 410(1) and 410(3), then match line MLA is maintained at a logic high level, thereby indicating a match. Conversely, if one or more bits of the "match" data word differ from those stored in CAM cells 410(1) and 410(3), then match line MLA is discharged to discharge line LMA, thereby switching match line MLA to a logic low level.

CAM cells 410(1) through 410(4) are described in additional detail below with reference to various embodiments the incorporate the novel aspects of the present invention.

First Embodiment: 5T Volatile CAM Cell

Figure 5A:
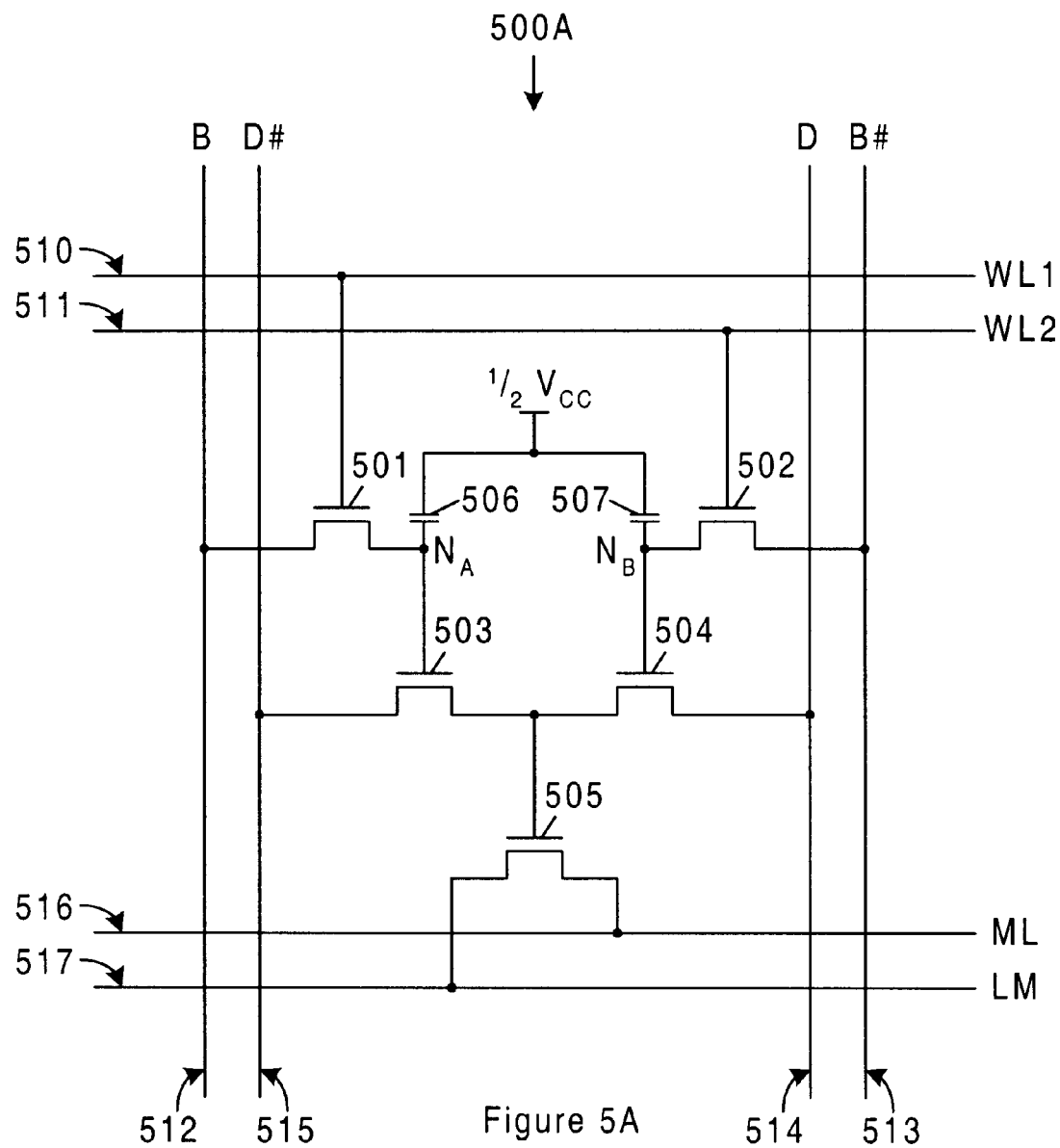
FIG. 5A is a schematic diagram of a ternary CAM cell in accordance with an embodiment of the present invention.

FIG. 5A is a schematic diagram of a novel five-transistor volatile ternary CAM cell 500A in accordance with an embodiment of the present invention. Ternary CAM cell 500A includes n-channel transistors 501–505 and storage capacitors 506–507. Transistors 501–502 have drains coupled to dynamic storage nodes $N_A$ and $N_B$, respectively. Transistors 503–504 have gates coupled to dynamic storage nodes $N_A$ and $N_B$, respectively. Capacitor 506 has a first plate coupled to a first plate of capacitor 507. Capacitors 506–507 have second plates coupled to dynamic storage nodes $N_A$ and $N_B$, respectively. Transistor 505 has a gate commonly coupled to the drains of transistors 503–504. Word lines WL1–WL2 are coupled to the gates of transistors 501–502, respectively. A first voltage (i.e., half of the $V_{cc}$ supply voltage) is coupled to the first plates of capacitors 506–507. A bit line 512 is coupled to a source of transistor 501. An inverted bit line 513 is coupled to a source of transistor 502. An inverted data line 515 is coupled to a source of transistor 503. A data line 514 is coupled to a source of transistor 504. A match line 516 is coupled to a source of transistor 505. A low match (discharge line) 517 is coupled to a drain of transistor 505.

Low match line 517 is coupled to a low match control circuit (e.g., control circuit 420 of FIG. 4A) that provides a voltage to low match line 517. In one embodiment, the low match circuit provides a steady state value of the $V_{ss}$ voltage supply source to ternary CAM cell 500A. In another embodiment, the low match circuit provides a signal to ternary CAM cell 500A which has a logic high value during the write or pre-charge operation of the match line, and a logic low value otherwise. In another embodiment, match line 516 and low match line 517 are controlled with a small signal swing (e.g., 0.6 Volts to 1.2 Volts). As a result, less power is consumed charging match line 516 and low match line 517 to a logic high value (e.g., 1.2 Volts) or a logic low value (e.g., 0.6 Volts). Note that the voltage corresponding to a logic low value on match line 516 and low match line 517 depends on the size of the signal swing. Thus, a signal swing of 0.6 Volts to 1.2 Volts has a logic low value of 0.6 Volts and a signal swing of 0 Volts to 3.3 Volts has a logic low value of 0 Volts.

The operation of ternary CAM cell 500A will now be described. During normal operation, CAM cell 500A is placed in various conditions, including standby, write, read, and compare. A standby condition exists when CAM cell 500A is not undergoing a read, write, or comparison operation. During a standby condition in CAM cell 500A, word lines 510–511 are held to logic low values, thereby turning off transistors 501–502. Data line 514 and inverted data line 515 are held to logic low values, thereby ensuring that transistor 505 is turned off. Bit line 512, inverted bit line 513, match line 516, and low match line 517 can have any value, but are preferentially held to their previous logic values.

A write operation for CAM cell 500A is performed as follows. Word lines 510–511 are held to logic high values. The data to be written to CAM cell 500A are provided on bit line 512 and inverted bit line 513. Data line 514, inverted data line 515, match line 516, and low match line 517 can have any value, but are preferentially held to their previous logic values.

CAM cell 500A stores one of three values: a logic high value, a logic low value, and a "don't care" logic value. To store a logic low value in CAM cell 500A, a logic low value is applied to bit line 512 and a logic high value is applied to inverted bit line 513. The logic high value of word line 510 turns on transistor 501, thereby applying the logic low value of bit line 512 to node $N_A$ and capacitor 506. The logic high value of word line 511 turns on transistor 502, thereby applying the logic high value of inverted bit line 513 to node $N_B$ and capacitor 507. As a result, node $N_A$ stores a logic low value and node $N_B$ stores a logic high value.

To store a logic high value in CAM cell 500A, a logic high value is applied to bit line 512, and a logic low value is applied to inverted bit line 513. The logic high value of word line 510 turns on transistor 501, thereby applying the logic high value of bit line 512 to node $N_A$ and capacitor 506. The logic high value of word line 511 turns on transistor 502, thereby applying the logic low value of inverted bit line 513 to $N_B$ and capacitor 107. As a result, node $N_A$ stores a logic high value and $N_A$ stores a logic low value.

To store a "don't care" logic value, logic low values are applied to bit line 512 and inverted bit line 513. The logic high value of word line 510 turns on transistor 501, thereby applying the logic low value of bit line 512 to node $N_A$ and capacitor 106. The logic high value of word line 511 turns on transistor 502, thereby applying the logic low value of inverted bit line 513 to node $N_B$ and capacitor 507. As a result, nodes $N_A$ and $N_B$ store logic low values.

A read operation for CAM cell 500A is performed as follows. Word lines 510–511 are held to logic high values.

Bit line 512 and inverted bit line 513 are pre-charged to logic high values. Data line 514, inverted data line 515, match line 516, and low match line 517 can have any value, but are preferentially held to their last logic values.

The logic high value of word line 510 turns on transistor 501, thereby coupling the value stored at node $N_A$ to bit line 512. As a result, if node $N_A$ stores a logic low value, bit line 512 is pulled down to a logic low value. If node $N_A$ stores a logic high value, the logic value of bit line 512 remains unchanged. The logic high value of word line 511 turns on transistor 502, thereby coupling the value stored by node $N_B$ to inverted bit line 513. As a result, if node $N_B$ stores a logic low value, the logic value of inverted bit line 513 is pulled down to a logic low value. If node $N_B$ stores a logic high value, the logic value of inverted bit line 513 remains unchanged. Therefore, if CAM cell 500A stores a logic low value, a read operation causes bit line 512 to have a logic low value and inverted bit line 513 to remain at a logic high value. If CAM cell 500A stores a logic high value, a read operation causes inverted bit line 513 to have a logic low value and bit line 512 to remain at a logic high value. If CAM cell 500A stores a "don't care" logic value, a read operation causes both bit line 512 and inverted bit line 513 to have logic low values.

A compare operation for CAM cell 500A is performed as follows. Match line 516 is pre-charged to a logic high value. Low match line 517 is held to a logic low value. Data to be compared is provided on data line 514 and inverted data line 515. Word lines 510–511 are held to logic low values. Bit line 512 and inverted bit line 513 can have any value, but are preferentially held to their last logic values.

If CAM cell 500A stores a logic low value, then the logic low value stored at node $N_A$ turns off transistor 503, thereby de-coupling inverted data line 515 to the gate of transistor 505. Additionally, the logic high value stored at node $N_B$ turns on transistor 504, thereby coupling data line 514 to the gate of transistor 505. As a result, a logic high value applied to data line 514 turns on transistor 505, thereby coupling match line 516 to low match line 517. Under these circumstances, match line 516 is discharged through low match line 517, thereby indicating a no-match condition. Conversely, a logic low value applied to data line 514 turns off transistor 505, thereby de-coupling match line 516 from low match line 517. Under these circumstances, match line 516 remains at a logic high value, thereby indicating a match condition.

If CAM cell 500A stores a logic high value, then the logic high value stored at node $N_A$ turns on transistor 503, thereby coupling inverted data line 515 to the gate of transistor 505. Additionally, the logic low value stored at node $N_B$ turns off transistor 504, thereby de-coupling data line 514 to the gate of transistor 505. As a result, a logic high value applied to inverted data line 515 turns on transistor 505, thereby coupling match line 516 to low match line 517. Under these circumstances, match line 516 is discharged through low match line 517, thereby indicating a no-match condition. Conversely, a logic low value applied to inverted data line 515 turns off transistor 505, thereby de-coupling match line 516 from low match line 517. Under these circumstances, match line 516 remains at a logic high value, thereby indicating a match condition.

If CAM cell 500A stores a "don't care" logic value, the logic low values stored at nodes $N_A$ and $N_B$ turn off transistors 503–504, respectively. Therefore, transistor 505 is turned off, thereby de-coupling match line 516 from low match line 517. As a result, when CAM cell 500A stores a "don't care" logic value, CAM cell 500A does not affect the charge on match line 516.

Note that because match line 516 and low match line 517 are signal lines and match line 516 discharges to low match line 517, the voltage on match line 516 and low match line 517 may be equalized during operations. As a result, the logic values stored at nodes $N_A$ and $N_B$ may turn on transistors 503–504, respectively, during standby operations without affecting the voltage on match line 516. Under these conditions, data line 514 and inverted data line 515 may be left in their last state without affecting the voltage on match line 516.

FIG. 5B is a schematic diagram of a novel ternary CAM cell 500B in accordance with a variation of the embodiment of FIG. 5A. The second terminals of capacitors 306–307 are not held to a fixed voltage. As a result, a connection to a fixed voltage is eliminated from CAM cell 500B, thereby lessening cell size from that of CAM cell 500A. Note that cell size may be further lessened by combining series capacitors 506–507 into a single capacitor with an equivalent capacitance. Similar elements between FIGS. 5A and 5B are labeled similarly. CAM cell 500B operates similarly to CAM cell 500A.

FIG. 5C is a schematic diagram of a novel ternary CAM cell 500C in accordance with another variation of the embodiment of FIG. 5A. The removal of capacitors 506–507 result in a smaller cell size than that of CAM cell 500A. Additionally, the removal of capacitors 506–507 results in a less complicated process. Similar elements between FIGS. 5A and 5C are labeled similarly. CAM cell 500C operates similarly to CAM cell 500A.

FIG. 5D is a schematic diagram of a novel ternary CAM cell 500D in accordance with another variation of the embodiment of FIG. 5A. Removal of data line 514 and inverted data line 515 by co-forming bit line 512 with inverted data line 515 (FIG. 5A) into bit/data line 520 and co-forming inverted bit line 513 with data line 514 (FIG. 5A) into inverted bit/data line 521 results in a smaller overall array size. Similar elements between FIGS. 5A and 5D are labeled similarly. CAM cell 500D operates similarly to CAM cell 500A. However, now the read/write data applied to bit line 512 (FIG. 5A) and the compare data applied to inverted data line 515 (FIG. 5A) are now both applied to bit line 520. Similarly, the read/write data formerly applied to inverted bit line 513 (FIG. 5A) and the compare data formerly applied to data line 514 (FIG. 5A) are now both applied to bit line 521.

Figure 1:
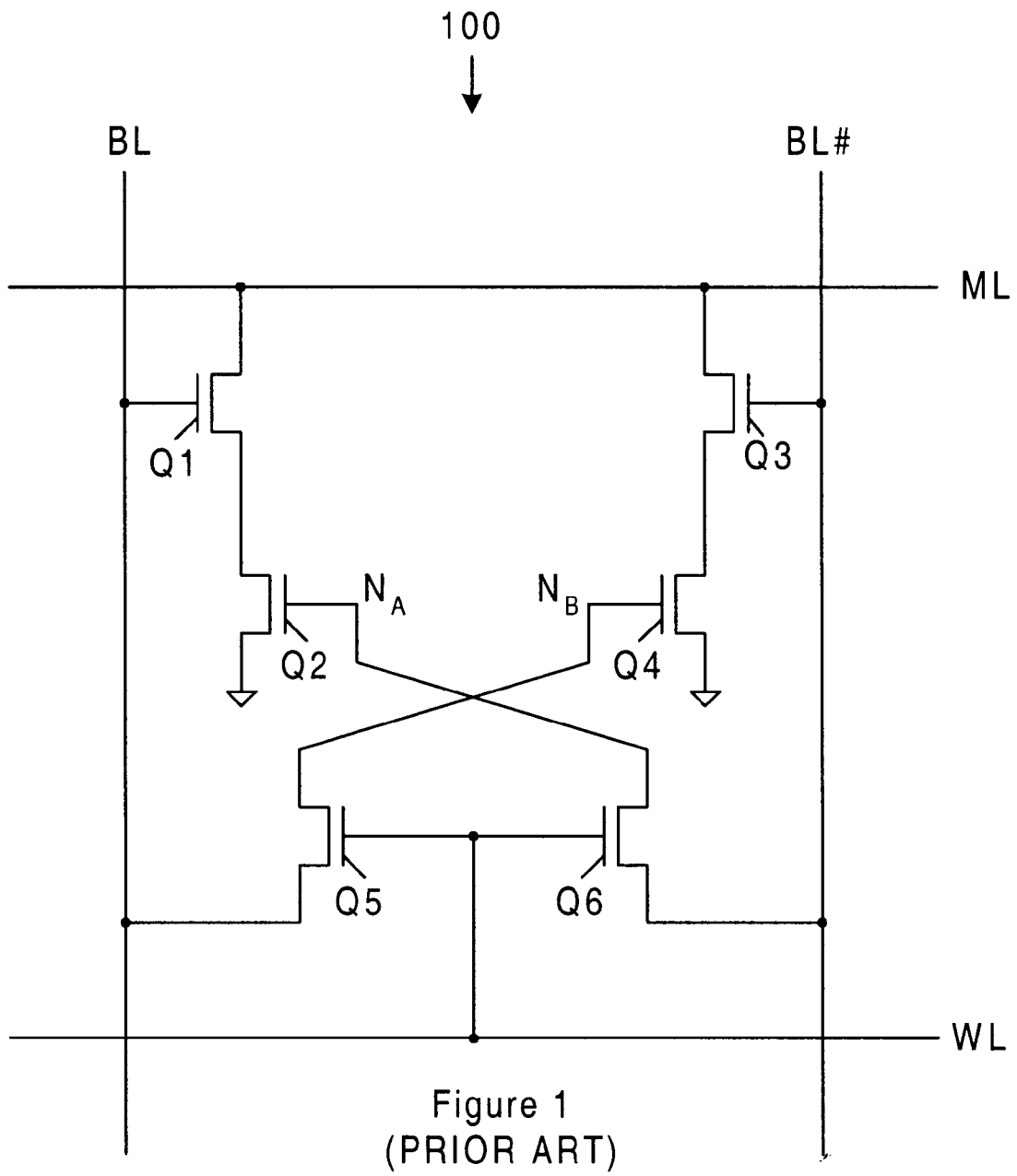
FIG. 1 is a schematic diagram of a first prior art volatile ternary CAM cell.
Figure 2:
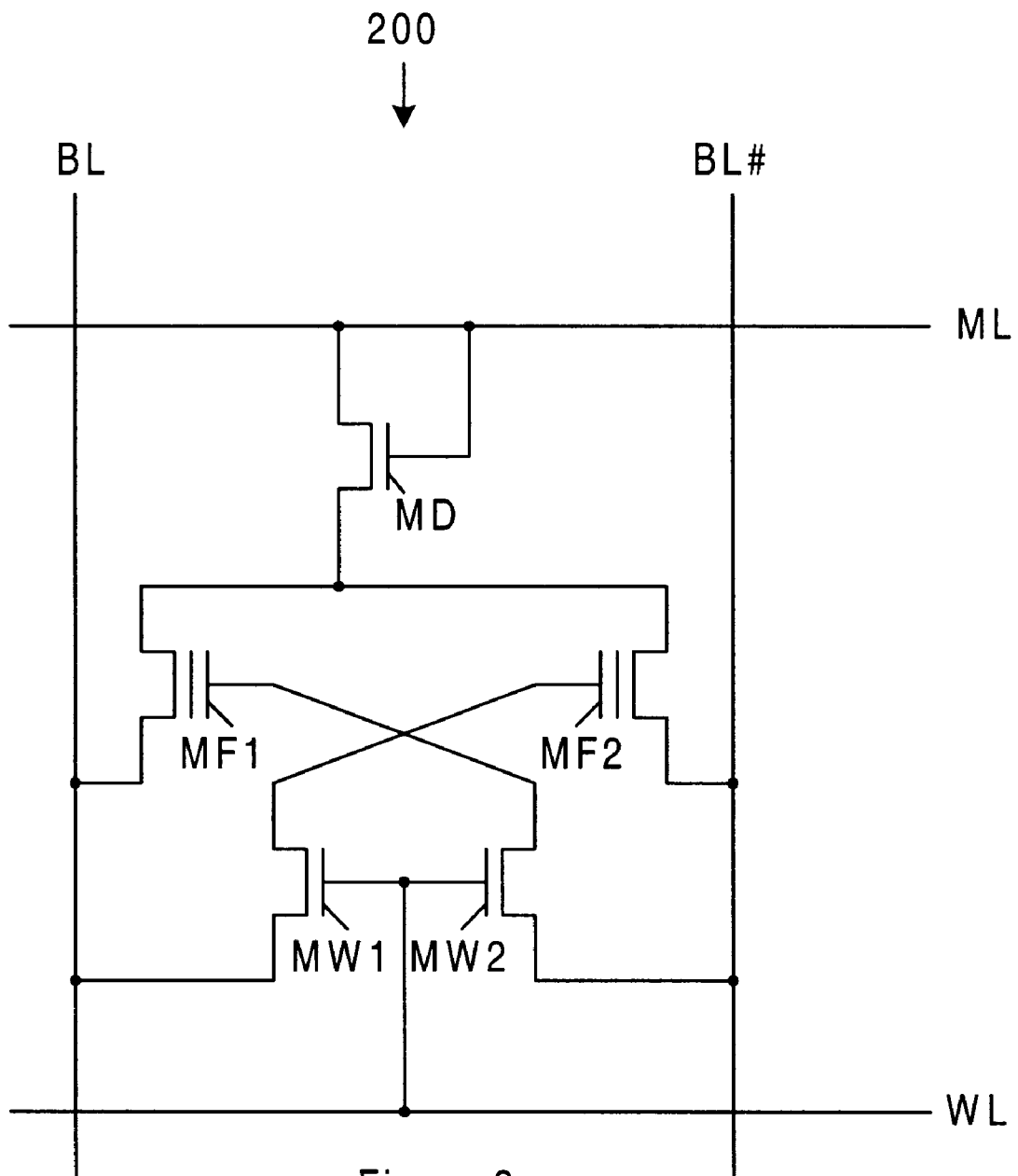
FIG. 2 is a schematic diagram of a second prior art non-volatile ternary CAM cell.
Figure 3:
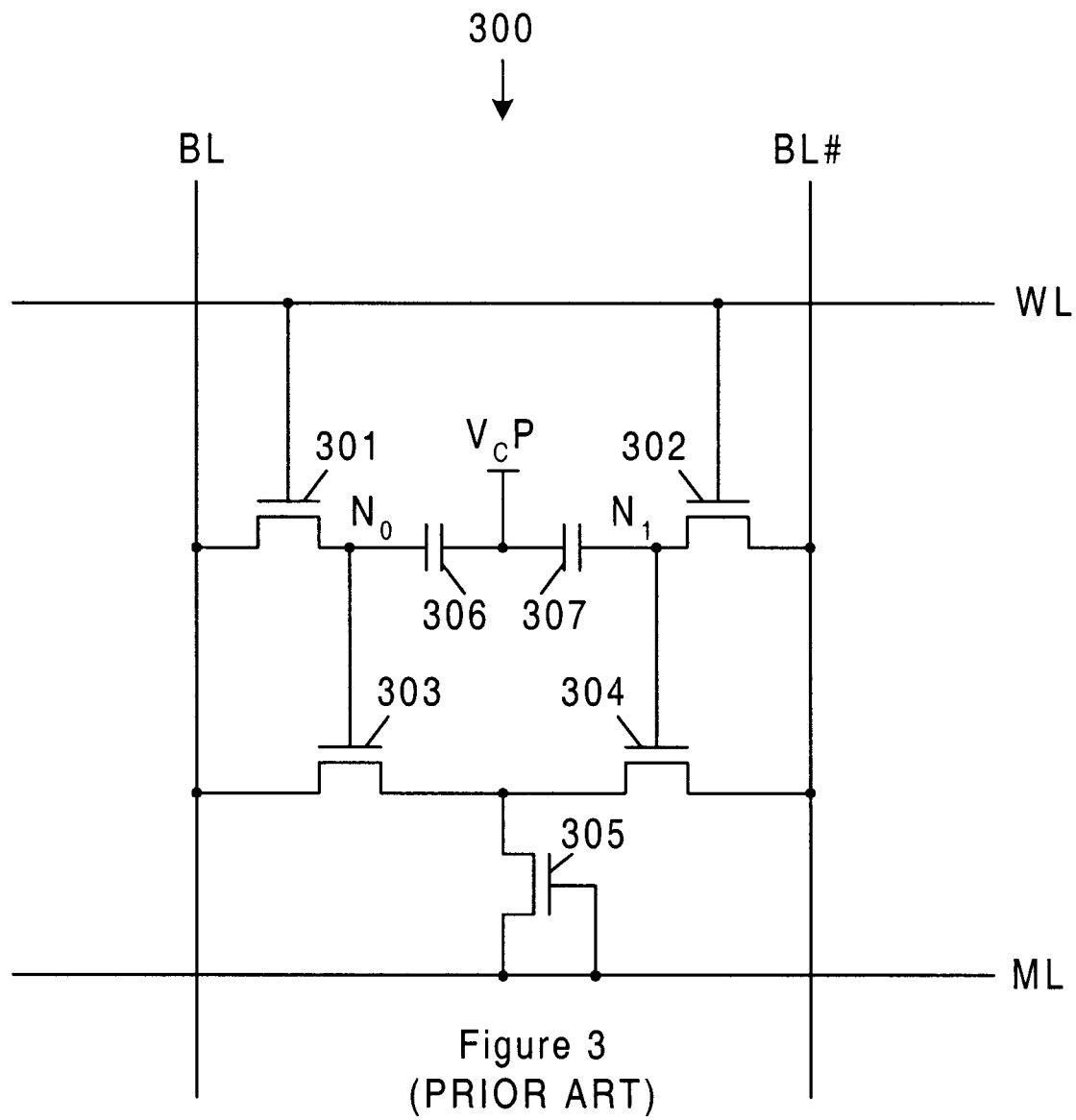
FIG. 3 is a schematic diagram of a third prior art volatile ternary CAM cell.

FIG. 5E is a schematic diagram of a novel ternary CAM cell 500E in accordance with another variation of the embodiment of FIG. 5A. CAM cell 500E discharges to ground instead of discharging to low match line 517 (FIG. 5A). As a result, the low match circuit (FIG. 1A) is not required for a CAM array including CAM cell 500E, thereby lessening CAM array requirements from those of a CAM array including CAM cell 500A. Similar elements between FIGS. 5A and 5E are labeled similarly. CAM cell 500E operates similarly to CAM cell 500A.

FIG. 5F is a schematic diagram of a novel ternary CAM cell 500F in accordance with another embodiment of the present invention. A CAM array including CAM cell 500F requires only one word line 522 (e.g., by co-forming word lines 510–511 (FIG. 5A)) for each row of CAM cells 500F, thereby lessening CAM array size as compared to a CAM array including CAM cell 500A. Similar elements between FIGS. 5A and 5F are labeled similarly. CAM cell 500F operates similarly to CAM cell 500A.

It is understood that the embodiments of FIGS. 5A–5F may be combined to produce additional embodiments which would be apparent to a person skilled in the art. For example, FIGS. 5C–5D may be combined to produce an embodiment having a combined bit line and inverted data line and having the voltage between capacitors determined by relative capacitance of the capacitors.

Second Embodiment: 6T Volatile CAM Cell

Figure 6:
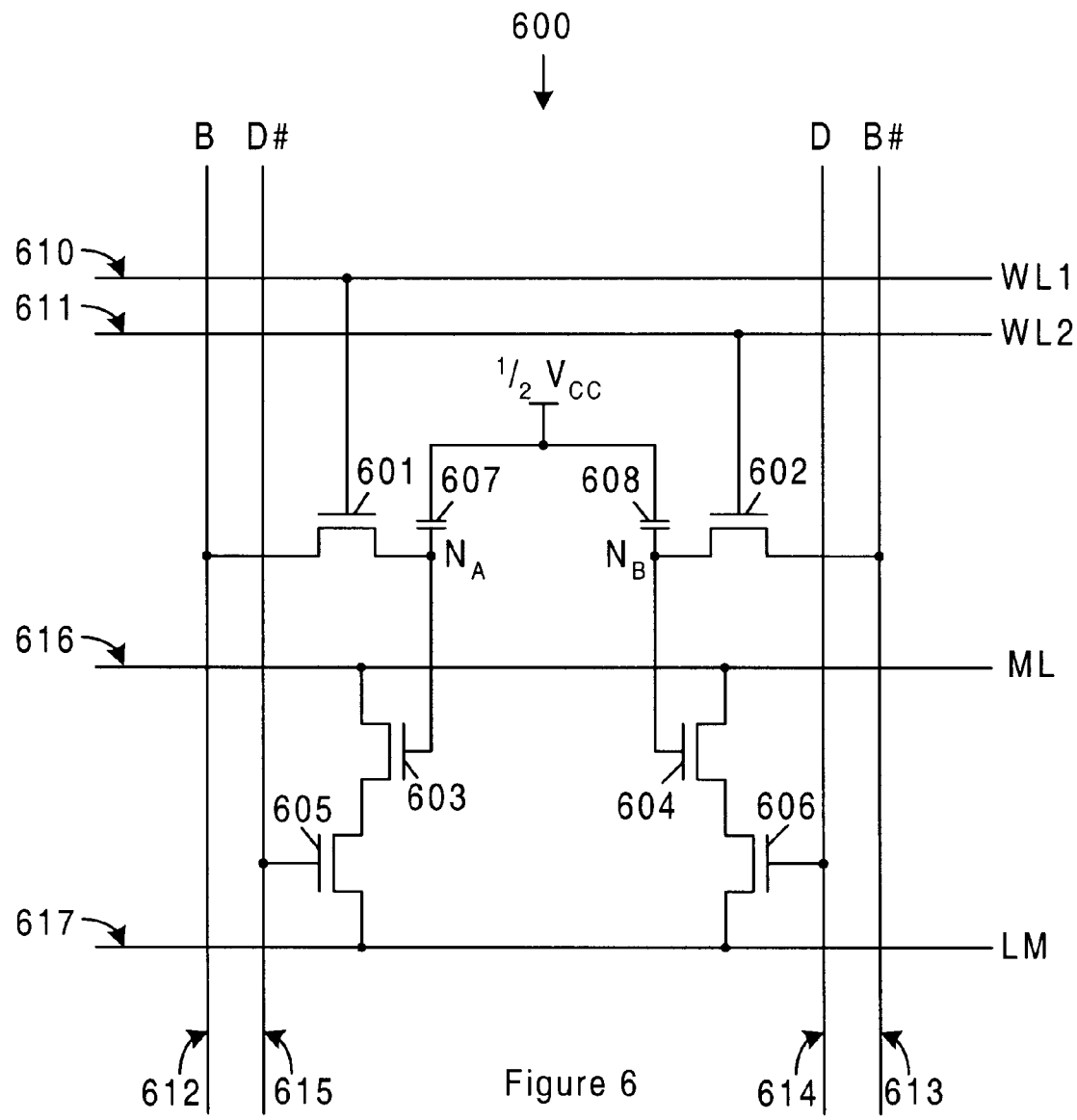
FIG. 6 is a schematic diagram of a novel ternary CAM cell in accordance with another embodiment of the present invention.

FIG. 6 is a schematic diagram of a novel ternary CAM cell 600 in accordance with another embodiment of the present invention. Ternary CAM cell 600 includes n-channel transistors 601-606 and storage capacitors 607–608. Capacitor 607 has a first plate coupled to a first plate of capacitor 608 and a second plate coupled to dynamic storage node $N_A$. Capacitor 608 has a second plate coupled to dynamic storage node $N_B$. Transistors 601–602 have drains coupled to nodes $N_A$ and $N_B$, respectively. Transistors 603–604 have gates coupled to nodes $N_A$ and $N_B$, respectively. Transistors 605–606 have sources coupled to the drains of transistors 603–604, respectively. A first voltage (e.g., half of the $V_{cc}$ supply voltage) is commonly coupled to the first plates of capacitors 607–608. Word lines 610–611 are coupled to the gates to the gates of transistors 601–602, respectively. Bit line 612 is coupled to the source of transistor 601 and inverted bit line 613 is coupled to the source of transistor 602. Data line 614 is coupled to the gate of transistor 606 and inverted data line 615 is coupled to the gate of transistor 605. Match line 616 is commonly coupled to the sources of transistors 603–604 and low match line 617 is commonly coupled to the drains of transistors 605–606.

The operation of ternary CAM cell 600 will now be described. Similar to CAM cell 500A, during normal operation, CAM cell 600 is placed in various conditions, including standby, write, read, and compare. Standby, write, and read operations for CAM cell 600 are similar to standby, write, and read operations for CAM cell 500A (described above).

A compare operation for CAM cell 600 is performed as follows. Match line 616 is pre-charged to a logic high value. Low match line 617 is held to a logic low value. Data to be compared is provided on data line 614 and inverted data line 615. Word lines 610–611 are held to logic low values. Bit line 612 and inverted bit line 613 can have any value, but are preferentially held their last logic values.

If CAM cell 600 stores a logic low value, then the logic low value stored at node $N_A$ turns off transistor 603, thereby de-coupling the source of transistor 605 from match line 616. Additionally, the logic high value stored at node $N_B$ turns on transistor 604, thereby coupling match line 616 to the source of transistor 606. As a result, a logic high value applied to data line 614 turns on transistor 606, thereby coupling match line 616 to low match line 617. Under these conditions, match line 616 is pulled down to a logic low value, thereby indicating a no-match condition. Conversely, a logic low value applied to data line 614 turns off transistor 606, thereby de-coupling match line 616 from low match line 617. Under these conditions, match line 616 will remain at a logic high value, thereby indicating a match condition.

If CAM cell 600 stores a logic high value, then the logic high value stored at node $N_A$ turns on transistor 203, thereby coupling match line 616 to the source of transistor 605. Additionally, the logic low value stored by capacitor 608 turns off transistor 604, thereby de-coupling match line 616 from the source of transistor 606. As a result, a logic high value applied to inverted data line 615 turns on transistor 605, thereby coupling match line 616 to low match line 617. Under these conditions, match line 616 will be pulled down to a logic low value, thereby indicating a no-match condition. Conversely, a logic low value applied to inverted data line 615 turns off transistor 605, thereby de-coupling match line 616 from low match line 617. Under these conditions, match line 616 will remain at a logic high value, thereby indicating a match condition.

If CAM cell 600 stores a "don't care" value, then the logic low values stored at nodes $N_A$ and $N_B$ turn off transistors 603–604, respectively. Therefore, match line 606 is de-coupled from low match line 617, thereby maintaining match line 616 at a logic high value. As a result, when CAM cell 600 stores a "don't care" value, CAM cell 600 returns a match condition.

Similar to CAM cell 500A, CAM cell 600 may be modified according to the structural variations described with reference to FIGS. 5B through 5F, along with combinations thereof, without altering the novel aspects of the present invention.

Third Embodiment: 6T Non-Volatile CAM Cell

Figure 7:
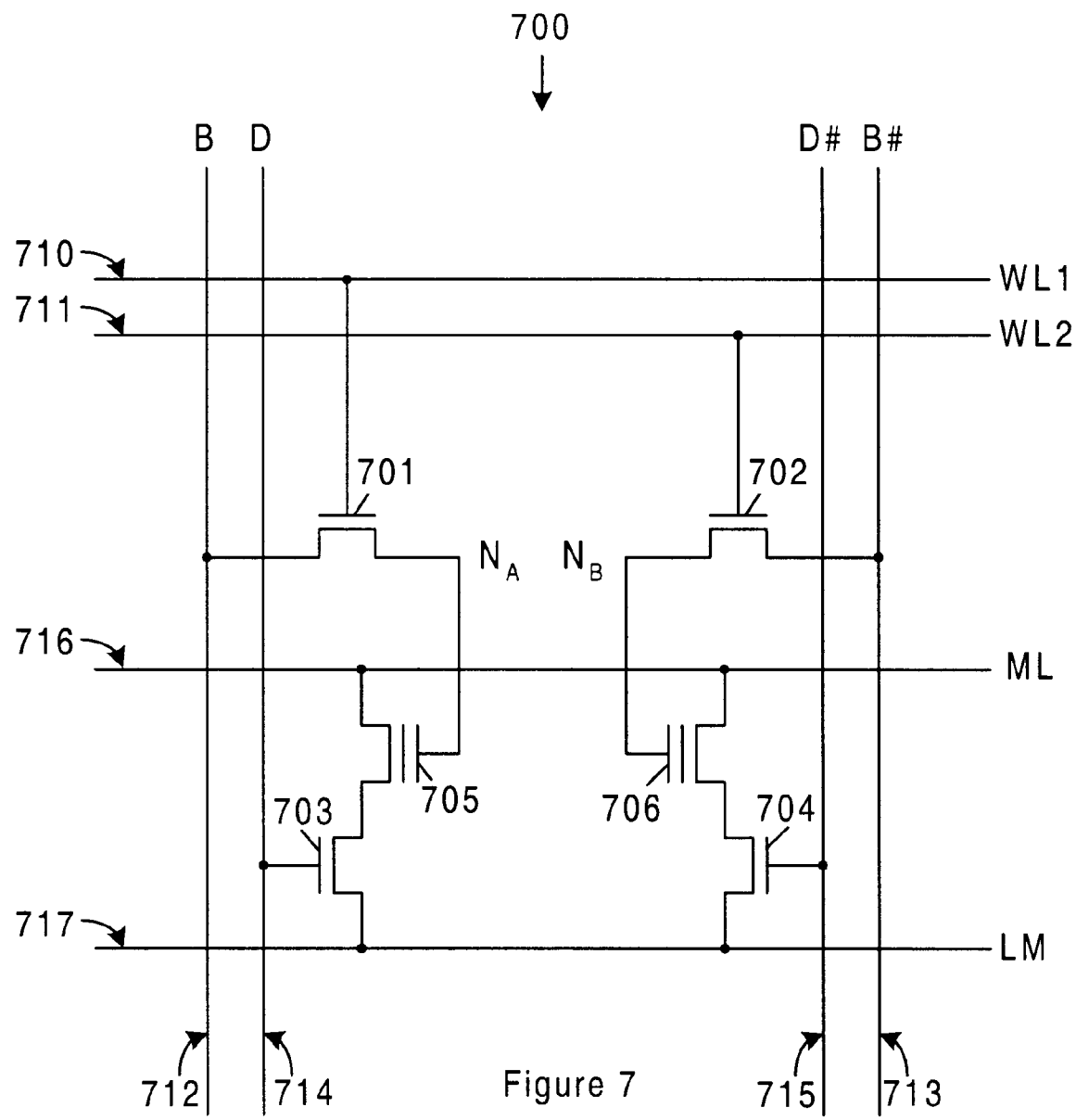
FIG. 7 is a schematic diagram of a novel ternary CAM cell in accordance with another embodiment of the present invention.

FIG. 7 is a schematic diagram of a novel ternary CAM cell 700 in accordance with another embodiment of the present invention. Ternary CAM cell 700 includes nchannel transistors 701–704 and non-volatile (e.g., EPROM) transistors 705–706. Transistor 705 has a gate coupled to a drain of transistor 701 at dynamic storage node $N_A$ and a drain coupled to a source of transistor 703. Transistor 706 has a gate coupled to a drain of transistor 702 at dynamic storage node $N_B$ and a drain coupled to a source of transistor 704. Word lines 710–711 are coupled to the gates of transistors 701–702, respectively. Bit line 712 and inverted bit line 713 are coupled to the sources of transistors 701–702, respectively. Data line 714 and inverted data line 715 are coupled to the gates of transistors 703–704, respectively. Match line 716 is commonly coupled to the sources of transistors 705–706. Low match line 716 is commonly coupled to the drains of transistors 703–704, respectively.

The operation of ternary CAM cell 700 will now be described. CAM cell 700 is placed in various conditions, including standby, write, read, and compare. During a standby condition, word lines 710–711 are held to logic low values, thereby turning off transistors 701–702. Bit line 712, inverted bit line 713, data line 714, inverted data line 715, match line 716, and low match line 717 can have any value, but are preferentially held to their previous logic values.

A write operation for CAM cell 700 is performed as follows. Word lines 710–711 are held to logic high values, thereby turning on transistors 701–702, respectively. The data to be written to CAM cell 700 are provided on data line 714 and inverted data line 715. Bit line 712 is held to the value applied to data line 714 and inverted bit line 713 is held to the value applied to inverted data line 715. Match line 716 is held to a programming voltage of roughly twice the $V_{cc}$ voltage supply source (e.g., 6.6 Volts) and low match line 717 is held to a logic low value.

Similarly to CAM cell 500A, CAM cell 700 stores one of three values: a logic high value, a logic low value, and a "don't care" value. To store a logic low value in CAM cell 700, non-volatile transistor 705 has a low threshold voltage and non-volatile transistor 706 has a high threshold voltage. Word lines 710–711 are held to logic high values, thereby turning on transistors 701–702, respectively. Bit line 712 is held to a logic low voltage, thereby providing a voltage equivalent to 0 Volts to the gate of non-volatile transistor 705 through turned on transistor 701. Inverted bit line 713 is held to a logic high voltage, thereby providing a voltage equivalent to the $V_{cc}$ supply voltage to the gate of non-volatile transistor 706 through turned on transistor 702. Match line 716 is held to a programming voltage of 6.6 Volts, thereby providing a voltage of 6.6 Volts to the sources of non-volatile transistors 705–706. Data line 714 is held to a logic low value, thereby turning off transistor 703. Inverted data line 715 is held to a logic high value, thereby turning on transistor 704. Low match line 717 is held to a logic low voltage, thereby providing a voltage of 0 Volts to the drain of non-volatile transistor 706 through turned on transistor 704. Under these conditions, current flows between the source and the drain and electrons are injected into the floating gate of turned-on non-volatile transistor 706, thereby raising the threshold voltage of non-volatile transistor 706. No current flows between the source and the drain of turned-off non-volatile transistor 705, which thus remains in a low threshold voltage state. As a result, non-volatile transistor 706 has a high threshold voltage and non-volatile transistor 705 stores a low threshold voltage.

To store a logic high value in CAM cell 700, non-volatile transistor 705 has a high threshold voltage and non-volatile transistor 706 has a low threshold voltage. Word lines 710–711 are held to logic high values, thereby turning on transistors 701–702, respectively. Bit line 712 is held to a logic high voltage, thereby providing a logic high voltage to the gate of non-volatile transistor 705 through turned on transistor 701. Inverted bit line 713 is held to a logic low value, thereby providing a logic low value to the gate of non-volatile transistor 706 through turned on transistor 702. Match line 716 is held to a programming voltage of 6.6 Volts, thereby providing a voltage of 6.6 Volts to the sources of non-volatile transistors 705–706. Data line 714 is held to a logic high value, thereby turning on transistor 703. Low match line 717 is held to a logic low voltage, thereby providing a logic low voltage to the drain of non-volatile transistor 705 through turned on transistor 703. Inverted data line 715 is held to a logic low value, thereby turning off transistor 704. Under these conditions, current flows between the source and the drain and electrons are injected into the floating gate of turned-on non-volatile transistor 705, thereby raising the threshold voltage of non-volatile transistor 705. No current flows between the source and the drain of turned-off non-volatile transistor 706, which thus remains in a low threshold voltage state. As a result, non-volatile transistor 705 has a high threshold voltage and non-volatile transistor 706 stores has a low threshold voltage.

To store a "don't care" value, non-volatile transistors 705–706 both have high threshold voltages. Word lines 710–711 are held to logic high values, thereby turning on transistors 701–702, respectively. Bit line 712 and inverted bit line 713 are held to logic high values, thereby providing a logic high value to the gates of non-volatile transistors 705–706, respectively, through turned on transistors 701–702, respectively. Match line 716 is held to a programming voltage of 6.6 Volts, thereby providing a voltage of 6.6 Volts to the sources of non-volatile transistors 705–706. Low match line 717 is held to a logic low voltage. Data line 714 and inverted data line 715 are held to a logic high values, thereby turning on transistors 703–704, respectively. As a result, the drains of non-volatile transistors 705–706 are coupled to the logic low voltage of low match line 717. Under these conditions, current flows between the source and drain and electrons are injected into the floating gates of each of turned-on non-volatile transistors 705–706, thereby raising the threshold voltage of each of non-volatile transistors 705–706.

A read operation for CAM cell 700 is performed as follows. Data line 714, inverted data line 715, match line 716, and low match line 717 are held to logic low values. Bit line 712 and inverted bit line 713 are pre-charged to a value equal to one-half the $V_{cc}$ voltage supply source (e.g., 1.65

Volts). Word lines 710–711 are held to logic high values, thereby turning on transistors 701–702. If non-volatile transistor 705 has a high threshold voltage, the logic high voltage stored at node $N_A$ pulls up on the voltage of bit line 712. However, if non-volatile transistor 705 has a low threshold voltage, the logic low voltage stored at node $N_A$ pulls down on the voltage of bit line 712. Therefore, the resultant voltage on bit line 712 changes in response to the threshold voltage of non-volatile transistor 705. Similarly, if non-volatile transistor 706 has a high threshold voltage, the logic high voltage stored at node $N_B$ pulls up on the voltage of inverted bit line 713. If non-volatile transistor 706 has a low threshold voltage, the logic low voltage stored at node $N_B$ pulls down on the voltage of inverted bit line 713. Therefore, the resultant voltage on inverted bit line 713 changes in response to the threshold voltage of non-volatile transistor 706. If bit line 712 is pulled up and inverted bit line 713 is pulled down, then CAM cell 700 stores a logic high value. If bit line 712 is pulled down and inverted bit line 713 is pulled up, then CAM cell 700 stores a logic low value. If both bit line 712 and inverted bit line 713 are pulled up, then CAM cell 700 stores a don't care logic value.

A compare operation for CAM cell 700 is performed as follows. Word lines 710–711, bit line 312, and inverted bit line 713 are held to logic high values. As a result, logic high values are applied to the gates of non-volatile transistors 705–706 through turned on transistors 701–702, respectively. Under these conditions, a non-volatile transistor having a low threshold voltage turns on and a non-volatile transistor having a high threshold voltage remains off. Match line 716 is pre-charged to a logic high value. Low match line 717 is held to a logic low value. Data to be compared is provided on data line 714 and inverted data line 715.

If CAM cell 700 stores a logic low value, then non-volatile transistor 705 has a low threshold voltage and non-volatile transistor 706 has a high threshold voltage. If a logic high value is compared to CAM cell 700, then a no-match condition exists. As a result, the logic low value applied to inverted data line 715 turns off transistor 704 and the logic high value applied to data line 714 turns on transistor 703, thereby coupling match line 716 to low match line 717 through turned on non-volatile transistor 705. Under these circumstances, match line 716 will be pulled down to a logic low value, thereby indicating the no-match condition. Conversely, if a logic low value is compared to CAM cell 700, then a match condition exists. As a result, the logic low value applied to data line 714 turns off transistor 703, thereby de-coupling low match line 717 from the drain of non-volatile transistor 705 and the logic high value applied to inverted data line 715 turns on transistor 704, thereby coupling low match line 717 to the drain of turned-off non-volatile transistor 706. Under these circumstances, match line 716 will remain at a logic high value, thereby indicating the match condition.

If CAM cell 700 stores a logic high value, then non-volatile transistor 705 has a high threshold voltage and non-volatile transistor 706 has a low threshold voltage. If a logic low value is compared to CAM cell 700, then a no-match condition exists. As a result, the logic low value applied to data line 714 turns off transistor 703 and the logic high value applied to inverted data line 715 turns on transistor 704, thereby coupling match line 716 to low match line 717 through turned on non-volatile transistor 706. Under these circumstances, match line 716 will be pulled down to a logic low value, thereby indicating the no-match condition. Conversely, if a logic high value is compared to CAM cell 700, then a match condition exists. As a result, the logic low value applied to inverted data line 715 turns off transistor 704, thereby de-coupling low match line 717 from the drain of non-volatile transistor 706 and the logic high value applied to data line 714 turns on transistor 703, thereby coupling low match line 717 to the drain of turned-off non-volatile transistor 705. Under these circumstances, match line 716 will remain at a logic high value, thereby indicating the match condition.

If CAM cell 700 stores a "don't care" value, then non-volatile transistors 705–706 have high threshold voltages. Therefore, non-volatile transistors 705–706 are turned off, thereby de-coupling match line 716 from low match line 717. As a result, match line 716 remains unchanged at a logic high value. Thus, when CAM cell 700 stores a "don't care" value, CAM cell 700 does not affect the charge on match line 716.

Similar to CAM cell 500A, CAM cell 700 may be modified according to the structural variations described with reference to FIGS. 5B through 5F, along with combinations thereof, without altering the novel aspects of the present invention.

Fourth Embodiment: 4T Volatile CAM Cell

Figure 8:
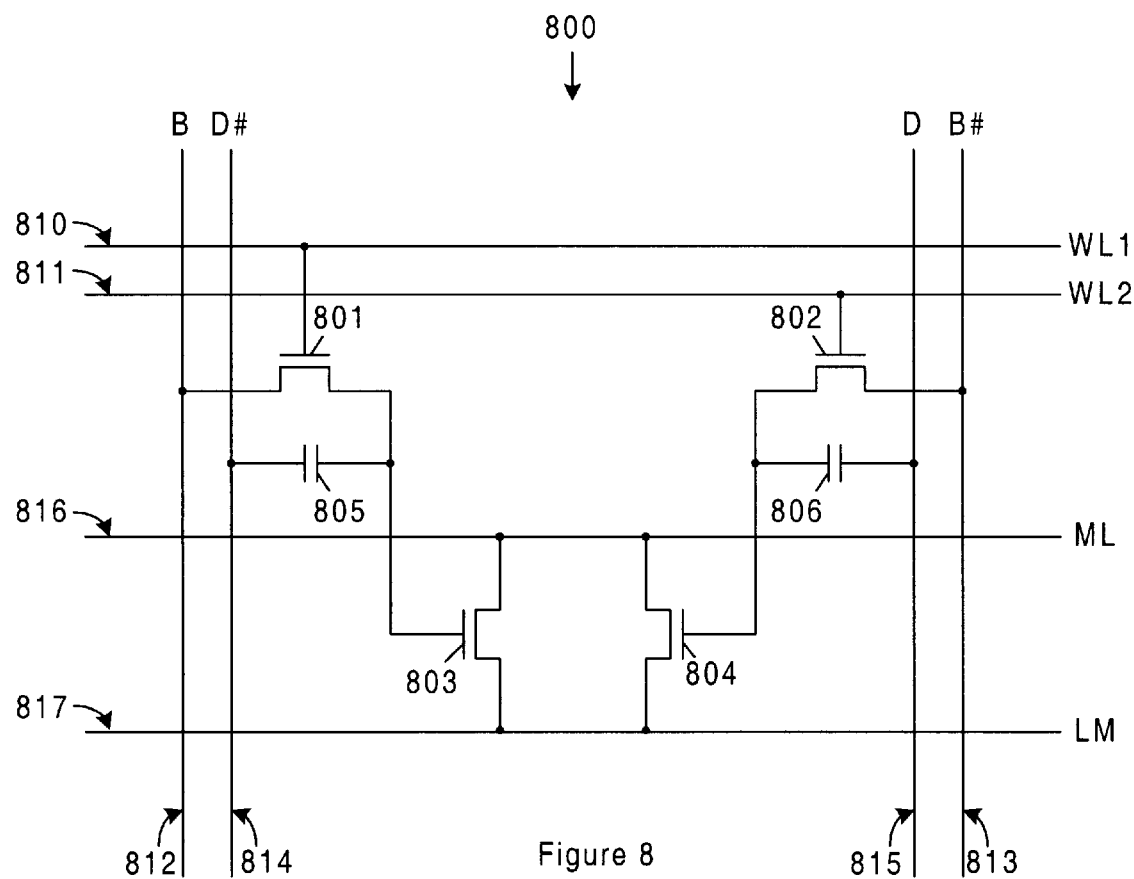
FIG. 8 is a schematic diagram of a novel ternary CAM cell in accordance with another embodiment of the present invention.

FIG. 8 is a schematic diagram of a novel ternary CAM cell 800 in accordance with another embodiment of the present invention. Ternary CAM cell 800 includes n-channel transistors 801–804 and capacitors 805–806. Transistor 801 has a drain coupled through node $N_A$ to a gate of transistor 803. Capacitor 805 has a first plate coupled to node $N_A$. Transistor 802 has a drain coupled through node $N_B$ to a gate of transistor 804. Capacitor 806 has a first plate coupled to node $N_B$. Word lines 810–811 are coupled to the gates of transistors 801–802, respectively. A bit line 812 is coupled to a source of transistor 801 and an inverted bit line 813 is coupled to a source of transistor 802. A data line 815 is coupled to a second plate of capacitor 806 and an inverted data line 814 is coupled to a second plate of capacitor 805. A match line 816 is commonly coupled to the sources of transistors 803–804. A low match line is commonly coupled to the drains of transistors 803–804.

The operation of ternary CAM cell 800 will now be described. During normal operation, CAM cell 800 is placed in various conditions, including standby, write, read, and compare. During a standby condition, word lines 810–811 are held to logic low values, thereby turning off transistors 801–802. Bit line 812, inverted bit line 813, data line 815, inverted data line 814, and match line 816 can have any value, but are preferentially held to their last logic values. Low match line 817 is held to the same logic value as match line 816.

A write operation for CAM cell 800 is performed as follows. Word lines 810–811 are held to logic high values, thereby turning on transistors 801–802, respectively. Data line 815 and inverted data line 814 are held to logic high values while match line 816 and low match line 817 are held to logic low values. The data to be written to CAM cell 800 are provided on bit line 812 and inverted bit line 813. Data is maintained in CAM cell 800 at dynamic storage nodes $N_A$ and $N_B$ by the relative capacitance between capacitors 801–802 and the gate capacitance of transistors 803–804, respectively. CAM cell 800 stores one of three values: a logic low value, a logic high value, and a "don't care" value. To store a logic low value in CAM cell 800, a logic low value is applied to bit line 812, and a logic high value is applied to inverted bit line 813. The logic high value of word line 810 turns on transistor 801, thereby applying the logic low value of bit line 812 at node $N_A$. The logic high value of word line 811 turns on transistor 802, thereby applying the logic high value of inverted bit line 813 at node $N_B$. As a result, node $N_A$ stores a logic low value (e.g., 0 Volts) and node $N_B$ stores a logic high value (e.g., 3.3 Volts).

To store a logic high value in CAM cell 800, a logic high value is applied to bit line 812, and a logic low value is applied to inverted bit line 813. The logic high value of word line 810 turns on transistor 801, thereby applying the logic high value of bit line 812 at node $N_A$. The logic high value of word line 811 turns on transistor 802, thereby applying the logic low value of inverted bit line 813 at node $N_B$. As a result, node $N_A$ stores a logic high value (e.g., 3.3 Volts) and node $N_B$ stores a logic low value (e.g., 0 Volts).

To store a "don't care" logic value in CAM cell 800, logic low values are applied to bit line 812 and inverted bit line 813. The logic high value of word line 810 turns on transistor 801, thereby applying the logic low value of bit line 812 at node $N_A$. The logic high value of word line 811 turns on transistor 802, thereby applying the logic low value of inverted bit line 813 at node $N_B$. As a result, both node $N_A$ and node $N_B$ store logic low values (e.g., 0 Volts).

A read operation for CAM cell 800 is performed as follows. Word lines 810–811 are held to logic high values, thereby turning on transistors 801–802. Bit line 612 and inverted bit line 613 are pre-charged to a voltage approximately equal to half the $V_{cc}$ supply voltage (e.g., 1.65 Volts). Data line 815 and inverted data line 814 are held to logic high values, while match line 816 and low match line 817 are held to logic low values.

The logic high value of word line 810 turns on transistor 801, thereby coupling the voltage stored at node $N_A$ to bit line 812. As a result, if node $N_A$ stores a logic low value (e.g., 0 Volts), then the voltage on bit line 812 is pulled down slightly. If node $N_A$ stores a logic high value (e.g., 3.3 Volts), then the voltage on bit line 812 is pulled up slightly. (Note that the amount of change on bit line 812 is proportional to the ratio of the capacitance of bit line 812 to the total capacitance of bit line 812 and capacitor 805). Similarly, the logic high value of word line 811 turns on transistor 802, thereby coupling the voltage stored at node $N_B$ to inverted bit line 813. As a result, if node $N_B$ stores a logic low value (e.g., 0 Volts), then the logic value of inverted bit line 813 is pulled down slightly. If node $N_B$ stores a logic high value (e.g., 3.3 Volts), then the voltage on inverted bit line 813 is pulled up slightly. (Similarly, note that the amount of change on inverted bit line 813 is proportional to the ratio of the capacitance of inverted bit line 813 to the total capacitance of inverted bit line 813 and capacitor 806). Therefore, if CAM cell 800 stores a logic low value, a read operation causes bit line 812 to have a voltage of less than half of the $V_{cc}$ supply voltage and inverted bit line 613 to have a voltage of more than half of the $V_{cc}$ supply voltage. If CAM cell 800 stores a logic high value, a read operation causes bit line 812 to have a voltage of more than half of the $V_{cc}$ supply voltage and inverted bit line 613 to have a voltage of less than half of the $V_{cc}$ supply voltage. If CAM cell 800 stores a "don't care" value, a read operation causes both bit line 812 and inverted bit line 813 to have a voltage of less than half of the $V_{cc}$ supply voltage. The voltage change on bit line 812 and inverted bit line 813 is sensed to determine the value stored by CAM cell 800.

A compare operation for CAM cell 800 is performed as follows. Match line 816 is pre-charged to a logic high value. Low match line 817 is held to a logic low value. Word lines 810–811 are held to logic low values, thereby turning off transistors 801–802. Bit line 812 and inverted bit line 813 can have any value, but are preferentially held to their previous logic values. Data to be compared is provided on data line 815 and inverted data line 814. These applied comparison data affect the voltage stored at nodes $N_A$ and $N_B$ in proportion to the capacitive coupling between capacitor 805 and transistor 803 and between capacitor 806 and transistor 804, respectively. In other words, the compare operation changes the voltage stored at node $N_A$ in proportion to the voltage applied to capacitor 805 (i.e., the inverted comparison data D#) and the ratio of the capacitance of capacitor 805 and the total capacitance of capacitor 805 and transistor 803. Similarly, the compare operation changes the voltage stored at node $N_B$ in proportion to the voltage applied to capacitor 806 (i.e., the comparison data D) and the ratio of the capacitance of capacitor 806 to the total capacitance of capacitor 806 and transistor 804. As a result, a logic high value applied to inverted data line 814 maintains the voltage stored at node $N_A$, while a logic low value applied to inverted data line 814 reduces the voltage stored at node $N_A$. Similarly, a logic high value applied to data line 815 maintains the voltage stored at node $N_B$, while a logic low value applied to data line 815 reduces the voltage stored at node $N_B$.

If CAM cell 800 stores a logic high value and a logic low value is compared to CAM cell 800, a no-match condition occurs. Specifically, the logic low value (e.g., 0 Volts) applied to data line 815 reduces the voltage stored at node $N_B$ (e.g., 0 Volts) in proportion to the change in applied voltage (from 3.3 Volts during standby, write, or read operations to 0 Volts during a compare operation) and the ratio of the capacitance of capacitor 806 to the total capacitance of capacitor 806 and transistor 804 (e.g., 9:(9+1=10)). As the voltage at node $N_B$ is already at 0 Volts and therefore below the threshold voltage of transistor 804, any reduction in the voltage at node $N_B$ maintains transistor 804 in an off state, thereby de-coupling match line 816 from low match line 817. The logic high value (i.e., 3.3 Volts) applied to inverted data line 814 reduces the voltage stored at node $N_A$ (e.g., 3.3 Volts) in proportion to the change in applied voltage (from 3.3 Volts during standby, write, or read operations to 3.3 Volts during a compare operation) and the ratio of the capacitance of capacitor 805 to the total capacitance of capacitor 805 and transistor 803 (e.g., 9:10). Because there is no change in the voltage on inverted data line 814, the voltage at node $N_A$ does not change, thereby remaining at a logic high value. The logic high value at node $N_A$, which is greater than the threshold voltage of transistor 803, turns on transistor 803, thereby coupling match line 816 to low match line 817. As a result, match line 816 is pulled down to a logic low value, thereby indicating a no-match condition. If CAM cell 800 stores a logic high value and a logic high value is compared to CAM cell 800, a match condition occurs. Specifically, the logic high value (e.g., 3.3 Volts) applied to data line 815 reduces the voltage stored at node $N_B$ (e.g., 0 Volts) in proportion to the change in applied voltage (from 3.3 Volts during standby, write, or read operations to 3.3 Volts during a compare operation) and the ratio of the capacitance of capacitor 806 to the total capacitance of capacitor 806 and transistor 804 (e.g., 9:10). Both because there is no change in voltage applied to bit line 815 and because the voltage at node NB is already at 0 Volts and therefore below the threshold voltage of transistor 804, the voltage at node $N_B$ maintains transistor 804 in an off state, thereby de-coupling match line 816 from low match line 817. The logic low value (i.e., 0 Volts) applied to inverted data line 814 reduces the voltage stored at node $N_A$ (e.g., 3.3 Volts) in proportion to the change in applied voltage (from 3.3 Volts during standby, write, or read operations to 0 Volts during a compare operation) and the ratio of the capacitance of capacitor 805 to the total capacitance of capacitor 805 and transistor 803 (e.g., 9:10). Thus, the voltage stored at node $N_A$ during a write operation (i.e., 3.3 Volts) less the capacitive coupling effect, which is determined by calculating the change in voltage (i.e., 3.3 Volts–0 Volts=3.3 Volts) applied to the inverted data line 814 multiplied by the capacitance ratio (i.e., 9/10), determines the new voltage stored at node $N_A$ (i.e., 3.3 Volts–(3.3 Volts)*(9/10)=0.33 Volts). The new voltage stored at node $N_A$, which is less than the threshold voltage of transistor 803, is insufficient to turn on transistor 803, thereby de-coupling match line 816 to low match line 817. As a result, match line 816 remains at a logic high value, thereby indicating a match condition.

If CAM cell 800 stores a logic low value and a logic high value is compared to CAM cell 800, a no-match condition occurs. Specifically, the logic low value (i.e., 0 Volts) applied to inverted data line 814 reduces the voltage stored at node $N_A$ (e.g., 0 Volts) in proportion to the change in applied voltage (from 3.3 Volts during standby, write, or read operations to 0 Volts during a compare operation) and the ratio of the capacitance of capacitor 805 to the total capacitance of capacitor 805 and transistor 803 (e.g., 9:10). Because the voltage at node $N_A$ is already at 0 Volts, and therefore less than the threshold voltage of transistor 803, transistor 803 remains turned off. As a result, match line 816 is de-coupled from low match line 817 through transistor 803. The logic low value (e.g., 3.3 Volts) applied to data line 815 reduces the voltage stored at node $N_B$ (e.g., 3.3 Volts) in proportion to the change in applied voltage (from 3.3 Volts during standby, write, or read operations to 3.3 Volts during a compare operation) and the ratio of the capacitance of capacitor 806 to the total capacitance of capacitor 806 and transistor 804 (e.g., 9:10). Because the change in applied voltage is 0 Volts, the voltage at node $N_B$ remains at 3.3 Volts, and therefore above the threshold voltage of transistor 804, thereby coupling match line 816 to low match line 817. The discharge of match line 816 indicates a no-match condition.

If CAM cell 800 stores a logic low value and a logic low value is compared to CAM cell 800, a match condition occurs. Specifically, the logic low value (e.g., 0 Volts) applied to data line 815 reduces the voltage stored at node $N_B$ (e.g., 3.3 Volts) in proportion to the change in applied voltage (from 3.3 Volts during standby, write, or read operations to 0 Volts during a compare operation) and the ratio of the capacitance of capacitor 806 to the total capacitance of capacitor 806 and transistor 804 (e.g., 9:10). Thus, the voltage stored at node $N_B$ during a write operation (i.e., 3.3 Volts) less the capacitive coupling effect, which is determined by calculating the change in voltage (i.e., 3.3 Volts–0 Volts=3.3 Volts) applied to the inverted data line 814 multiplied by the capacitance ratio (i.e., 9/10), determines the new voltage stored at node $N_B$ (i.e., 3.3 Volts–(3.3 Volts)*(9/10) =0.33 Volts). The new voltage stored at node $N_B$, which is less than the threshold voltage of transistor 804, is insufficient to turn on transistor 804, thereby de-coupling match line 816 from low match line 817. The logic high value (i.e., 3.3 Volts) applied to inverted data line 814 reduces the voltage stored at node $N_A$ (e.g., 0 Volts) in proportion to the change in applied voltage (from 3.3 Volts during standby, write, or read operations to 3.3 Volts during a compare operation) and the ratio of the capacitance of capacitor 805 to the total capacitance of capacitor 805 and transistor 803 (e.g., 9:10). Because the voltage at node $N_A$ is already at 0 Volts, and therefore less than the threshold voltage of transistor 803, transistor 803 remains turned off. As a result, match line 816 remains at a logic high value, thereby indicating a match condition.

Similarly, if a "don't care" logic value is stored in CAM cell, a match condition occurs for all applied compare data. Both node $N_A$ and node $N_B$ store logic low values, thereby turning off transistors 803 and 804. The capacitive coupling effect maintains nodes $N_A$ and $N_B$ at voltages below the threshold voltages of transistors 803–804, respectively. As a result, match line 816 remains de-coupled from low match line 817 and therefore at a logic high value.

Similar to CAM cell 500A, CAM cell 800 may be modified according to the structural variations described with reference to FIGS. 5B through 5F, along with combinations thereof, without altering the novel aspects of the present invention.

Although the invention has been described in connection with a number of described embodiments, it is understood that this invention is not limited to the embodiments disclosed, but is capable of various modifications which would be apparent to a person skilled in the art. For example, capacitors may be added to the embodiment of FIG. 700 to aid in data storage. Thus, the invention is limited only by the following claims.

What is claimed is:

1. A content-addressable memory (CAM) array comprising:
   a bit line;
   a word line;
   a match line;
   a discharge line;
   a content-addressable memory (CAM) cell including:
      means coupled to the bit line and the word line for storing a first data value during a set-up phase, and
      a comparison circuit coupled between the match line and the discharge line for comparing the stored value received from the storage circuit with an applied data value and for connecting the match line to the discharge line if the stored value is different from the data value; and
   a control circuit coupled to the discharge line for applying a first voltage to the discharge line during the set-up phase, and for applying a second voltage to the discharge line during the comparison phase.

2. An integrated circuit including a bit line, a word line, a match line, a discharge line, and a content-addressable memory (CAM) cell, the CAM cell comprising:
   a first volatile transistor having a first terminal coupled to the bit line, a second terminal, and a gate terminal coupled to the word line;
   a second volatile transistor having a first terminal coupled to receive a data signal, a second terminal, and a gate terminal coupled to the second terminal of the first volatile transistor; and
   a third volatile transistor having a first terminal coupled to the match line, a second terminal coupled to the discharge line, and a gate terminal coupled to the second terminal of the second volatile transistor;
      wherein the third volatile transistor is turned on to shunt the match line to the discharge line when the bit line, the word line, and the data signal received by the second volatile transistor are high during a predetermined time period.

3. A ternary content addressable memory (CAM) cell comprising:
   a first storage element;
   a second storage element;
   a first access transistor having a first terminal coupled to the first storage element, a second terminal, and a gate terminal;

a first word line coupled to the gate terminal of the first access transistor;

a first bit line coupled to the second terminal of the first access transistor;

a second access transistor having a first terminal coupled to the second storage element, a second terminal, and a gate terminal;

a second word line coupled to the gate terminal of the second access transistor;

a second bit line coupled to the second terminal of the second access transistor;

a first comparison transistor having a gate terminal coupled to the first storage element, a first terminal and a second terminal;

a first data line coupled to the first terminal of the first comparison transistor;

a second comparison transistor having a gate terminal coupled to the second storage element, a first terminal and a second terminal;

a second data line coupled to the first terminal of the second comparison transistor;

a third comparison transistor having a gate terminal coupled to the second terminal of the first comparison transistor and coupled to the second terminal of the second comparison transistor, a first terminal and a second terminal;

a match line coupled to the first terminal of the third comparison transistor; and a low match line coupled to the second terminal of the third comparison transistor.

4. The ternary CAM cell of claim 3, wherein the first storage element comprises a wire.

5. The ternary CAM cell of claim 3, wherein the first storage element comprises a first capacitor.

6. The ternary CAM cell of claim 5, wherein the second storage element comprises a second capacitor.

7. The ternary CAM cell of claim 6, wherein a plate of the first capacitor is coupled to a plate of the second capacitor.

8. The ternary CAM cell of claim 6, wherein a first voltage source is coupled between the first capacitor and the second capacitor.

9. The ternary CAM cell of claim 3, wherein the first bit line is co-formed with the first data line and the second bit line is co-formed with the second data line.

10. The ternary CAM cell of claim 3, wherein the first word line is co-formed with the second word line.

11. The ternary CAM cell of claim 3, wherein the low match line comprises a voltage controlling circuit.

12. The ternary CAM cell of claim 3, wherein the low match line is coupled to a ground.

13. A ternary content addressable memory (CAM) cell comprising:

a first storage element;

a second storage element;

a first access transistor having a first terminal coupled to the first storage element, a second terminal, and a gate terminal;

a first word line coupled to the gate terminal of the first access transistor;

a first bit line coupled to the second terminal of the first access transistor;

a second access transistor having a first terminal coupled to the second storage element, a second terminal, and a gate terminal;

a second word line coupled to the gate terminal of the second access transistor;

a second bit line coupled to the second terminal of the second access transistor;

a first comparison transistor having a gate terminal coupled to the first storage element, a first terminal and a second terminal;

a second comparison transistor having a first terminal coupled to the first terminal of the first comparison transistor, a second terminal and a gate terminal;

a first data line coupled to the gate terminal of the second comparison transistor;

a third comparison transistor having a gate terminal coupled to the second storage element, a first terminal, and a second terminal;

a fourth comparison transistor having a first terminal coupled to a drain of the third comparison transistor, a second terminal, and a gate terminal;

a second data line coupled to the gate terminal of the fourth comparison transistor;

a match line coupled to the second terminal of the first comparison transistor and to the second terminal of the third comparison transistor; and a low match line coupled to the second terminal of the second comparison transistor and to the second terminal of the fourth comparison transistor.

14. The ternary CAM cell of claim 13, wherein the first storage element comprises a wire.

15. The ternary CAM cell of claim 13, wherein the first storage element comprises a first capacitor.

16. The ternary CAM cell of claim 15, wherein the second storage element comprises a second capacitor.

17. The ternary CAM cell of claim 16, wherein a plate of the first capacitor is coupled to a plate of the second capacitor.

18. The ternary CAM cell of claim 16, wherein a first voltage source is coupled between the first capacitor and the second capacitor.

19. The ternary CAM cell of claim 13, wherein the first bit line is co-formed with the first data line, and the second bit line is co-formed with the second data line.

20. The ternary CAM cell of claim 13, wherein the first word line is co-formed with the second word line.

21. The ternary CAM cell of claim 13, wherein the low match line comprises a voltage controlling circuit.

22. The ternary CAM cell of claim 13, wherein the low match line is coupled to a ground.

23. A ternary content addressable memory (CAM) cell comprising:

a first non-volatile transistor having a first terminal, a second terminal, and a gate terminal;

a second non-volatile transistor having a first terminal, a second terminal, and a gate terminal;

a first access transistor having a first terminal coupled to a gate of the first non-volatile transistor, a second terminal, and a gate terminal;

a first word line coupled to the gate terminal of the first access transistor;

a first bit line coupled to the second terminal of the first access transistor;

a second access transistor having a first terminal coupled to the gate terminal of the second non-volatile transistor, a second terminal, and a gate terminal;

a second word line coupled to the gate terminal of the second access transistor;

a second bit line coupled to the second terminal of the second access transistor;

a first comparison transistor having a first terminal coupled to the first terminal of the first non-volatile transistor, a second terminal, and a gate terminal;

a first data line coupled to the gate terminal of the first comparison transistor;

a second comparison transistor having a first terminal coupled to the first terminal of the second non-volatile transistor, a second terminal, and a gate terminal;

a second data line coupled to the gate terminal of the second comparison transistor;

a match line coupled to the second terminal of the first non-volatile transistor and to the second terminal of the second non-volatile transistor; and a low match line coupled to the second terminal of the first comparison transistor and to the second terminal of the second comparison transistor.

24. The ternary CAM cell of claim 23, wherein the first bit line is co-formed with the first data line and the second bit line is co-formed with the second data line.

25. The ternary CAM cell of claim 23, wherein the first word line is co-formed with the second word line.

26. The ternary CAM cell of claim 23, wherein the low match line comprises a voltage controlling circuit.

27. The ternary CAM cell of claim 23, wherein the low match line is coupled to a ground.

28. A ternary content addressable memory (CAM) cell comprising:

a first capacitor;

a second capacitor;

a first access transistor having a first terminal coupled to a first plate of the first capacitor, a second terminal, and a gate terminal;

a first word line coupled to the gate terminal of the first access transistor;

a first bit line coupled to the second terminal of the first access transistor;

a first data line coupled to a second plate of the first capacitor;

a second access transistor having a first terminal coupled to a first plate of the second capacitor, a second terminal, and a gate terminal;

a second word line coupled to the gate terminal of the second access transistor;

a second bit line coupled to the second terminal of the second access transistor;

a second data line coupled to a second plate of the second capacitor;

a first comparison transistor having a gate coupled to the first plate of the first capacitor;

a second comparison transistor having the gate terminal coupled to the second plate of the second capacitor;

a match line coupled to the first terminal of the first comparison transistor and to the first terminal of the second comparison transistor; and a low match line coupled to the second terminal of the first comparison transistor and to the second terminal of the second comparison transistor.

29. A method of operating a CAM array including a match line, a low match line, a plurality of data lines, and a plurality of CAM cells arranged in a row, each CAM cell being connected to an associated data line and including a switch connected between the match line and the low match line, the switch being controlled by a first data value stored in said each CAM cell, the method comprising:

during a pre-charge operation, equalizing a voltage level on the low match line with a the voltage level on the match line, thereby preventing current flow between the low match line and the match line through the switch; and during a subsequent operation, pulling down on the voltage level on the low match line to a logic low voltage level, thereby causing the match line to discharge to the low match line.

30. The method of claim 29, wherein the subsequent operation is a read operation.

31. The method of claim 29, wherein the subsequent operation is a compare operation.

32. The method of claim 29, wherein the subsequent operation is a write operation.

* * * * *